United States Patent
Kobashi et al.

(10) Patent No.: US 9,829,532 B2
(45) Date of Patent: Nov. 28, 2017

(54) SEMICONDUCTOR DEVICE AND METHOD OF DIAGNOSING SEMICONDUCTOR DEVICE

(71) Applicant: Renesas Electronics Corporation, Tokyo (JP)

(72) Inventors: Hisao Kobashi, Kodaira (JP); Yasuhiko Fukushima, Kodaira (JP); Mikio Asai, Kodaira (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/365,572

(22) Filed: Nov. 30, 2016

(65) Prior Publication Data

US 2017/0168109 A1   Jun. 15, 2017

(30) Foreign Application Priority Data

Dec. 14, 2015  (JP) ................. 2015-243194

(51) Int. Cl.
*G11C 11/00* (2006.01)
*G01R 31/26* (2014.01)
*G11C 11/419* (2006.01)
*G11C 29/12* (2006.01)
*G06F 3/06* (2006.01)

(52) U.S. Cl.
CPC ....... *G01R 31/2642* (2013.01); *G06F 3/0614* (2013.01); *G06F 3/0653* (2013.01); *G06F 3/0679* (2013.01); *G11C 11/419* (2013.01); *G11C 29/12* (2013.01)

(58) Field of Classification Search
CPC .................................... G11C 11/412
USPC .......................................... 365/154
See application file for complete search history.

(56) References Cited

U.S. PATENT DOCUMENTS

| | | | |
|---|---|---|---|
| 2007/0211527 A1* | 9/2007 | Hsu ............. | G11C 11/4125 365/185.02 |
| 2013/0222071 A1* | 8/2013 | Chuang ........... | G11C 7/04 331/57 |
| 2016/0247554 A1* | 8/2016 | Mojumder ....... | G11C 11/419 |
| 2016/0351250 A1* | 12/2016 | Narayanan ....... | G11C 11/417 |

FOREIGN PATENT DOCUMENTS

JP      2014-235060 A      12/2014

* cited by examiner

*Primary Examiner* — Hoai V Ho
(74) *Attorney, Agent, or Firm* — McGinn IP Law Group PLLC

(57) ABSTRACT

A semiconductor device suitable for predicting failures is provided. A semiconductor device including a logic circuit and a static memory having a plurality of first static memory cells formed on a semiconductor substrate, further includes a monitor memory circuit having a second static memory cell formed on the semiconductor substrate, and a monitor circuit MON applying stress to the second static memory cell during a period in which the semiconductor device operates so that a state of the second static memory cell can be notified.

20 Claims, 13 Drawing Sheets

SEMICONDUCTOR DEVICE AND METHOD OF DIAGNOSING SEMICONDUCTOR DEVICE

CROSS-REFERENCE TO RELATED APPLICATION

The present application claims priority from Japanese Patent Application No. 2015-243194 filed on Dec. 14, 2015, the content of which is hereby incorporated by reference into this application.

TECHNICAL FIELD OF THE INVENTION

The present invention relates to a semiconductor device and a method of diagnosing the semiconductor device. More particularly, the present invention relates to a semiconductor device having a static memory and a method of diagnosing the semiconductor device.

BACKGROUND OF THE INVENTION

As an example of a semiconductor device, a semiconductor device in which a test circuit performing a diagnosis or others is previously embedded is cited. As an example of the test circuit, a scan path or others is cited, the scan path supplying a test pattern as an input to a circuit block in the semiconductor device such as a circuit block in accordance with a user, and outputting an output from the circuit block. A semiconductor device supplier (hereinafter, also referred to as a semiconductor manufacturer) that provides a user with a semiconductor device and/or the user can detect whether a failure has occurred in a semiconductor device or not by using a test circuit such as a scan path. For example, the semiconductor manufacturer can detect a failure in a semiconductor device during a test process by using a test circuit before providing the semiconductor device. And, for example, when configuring an electronic device by using a provided semiconductor device, the user can detect a failure in the semiconductor device by using a test circuit embedded in the semiconductor device.

This test circuit such as a scan path detects a failure that has occurred in a semiconductor device. That is, the test circuit detects a failure after the failure occurs. Therefore, when it is not easy to replace a semiconductor device or an electronic device using the semiconductor device, even if the failure of the semiconductor device is detected, the semiconductor device or the electronic device cannot be used for a long time. In addition, in a semiconductor device used in a public infrastructure or others, even if a period of time from the detection of the failure to the replacement is short, this is a large impact.

A technique relating to a failure in a semiconductor device is described in, for example, Japanese Patent Application Laid-open Publication No. 2014-235060 (Patent Document 1).

SUMMARY OF THE INVENTION

In a test circuit capable of detecting a failure after the failure occurs, a period of time in which a semiconductor device or an electronic device cannot be used is long, or a large impact is caused as described above. Therefore, it is desirable to predict a failure before the failure occurs.

The Patent Document 1 describes that the failure is predicted by providing a failure detecting circuit having the same configuration as that of a practical operational circuit. However, this describes only a concept, and does not describe a semiconductor device suitable for predicting the failure.

The other object and novel characteristics of the present invention will be apparent from the description of the present specification and the accompanying drawings.

A semiconductor device according to one embodiment includes a plurality of first static memory cells, a second static memory cell, and a logic circuit, formed on the same semiconductor substrate. A storage circuit is formed of the plurality of first static memory cells. The second static memory cell is provided to a monitor circuit. During a period in which the semiconductor device operates, stress is applied to the second static memory cell, and a state of the second static memory cell is notified.

The first static memory cells, the second static memory cell, and the logic circuit are formed of the same transistor as one another. Therefore, when the stress is applied to, for example, the first static memory cells, the second static memory cell, and the logic circuit, characteristics of the transistor forming them vary as the same as one another. Therefore, by applying the stress to the second static memory cell to check the state of the second static memory cell, a state caused when the stress is applied to the first static memory cells and the logic circuit can be estimated. Since the stress to the second static memory cell is applied during the period in which the semiconductor device operates, for example, a user can estimate the state caused when the stress is applied to the first static memory cells and the logic circuit, during the period in which the semiconductor device operates, so that the failures can be predicted.

From the second static memory cell, data of a logical value corresponding to a logical value of written data which is "0" or "1" is read. Therefore, the state of the second static memory cell to which the stress is applied can be checked by determining the logical value of the read data.

In terms of the determination of the logical value of the read data by reading the written data, it is conceivable that a memory provided in the monitor circuit may be not the static memory cell but a dynamic memory cell or an electrically rewritable nonvolatile memory cell. In the dynamic memory cell, electric charge corresponding to data is accumulated in a capacitive element, so that the data is stored. The transistor configuring the logic circuit and the capacitive element configuring the dynamic memory cell are different from each other in terms of variation of the characteristics obtained when the stress is applied thereto. Thus, the dynamic memory cell is not suitable for being used to predict the failure.

In the electrically rewritable nonvolatile memory cell, for example, electrons corresponding to data are trapped by a specific insulating layer, so that the data is stored. The transistor configuring the logic circuit does not have such a specific insulating layer. Thus, the logic circuit and the electrically rewritable nonvolatile memory cell are different from each other in terms of variation of characteristics when the stress is applied thereto. Therefore, the electrically rewritable nonvolatile memory cell is not suitable for being used to predict the failure.

A method of diagnosing a semiconductor device according to one embodiment includes: an operation step of operating a semiconductor device including a logic circuit and a storage circuit having a plurality of first static memory cells; and a test step of applying a stress to a second static memory cell during the operation step.

According to one embodiment, a semiconductor device suitable for predicting a failure can be provided.

BRIEF DESCRIPTIONS OF THE DRAWINGS

DESCRIPTIONS OF THE PREFERRED EMBODIMENTS

Hereinafter, embodiments of the present invention will be described in detail with reference to the accompanying drawings. Note that the same components are denoted by the same reference symbols throughout all the drawings for describing the embodiments, and the repetitive description thereof will be omitted.

In the present specification, the explanation will be made while exemplifying a semiconductor device required to have high reliability such as an on-vehicle semiconductor device which is mounted on a motor vehicle.

(First Embodiment)

<Entire Configuration of Semiconductor Device>

Figure 1:
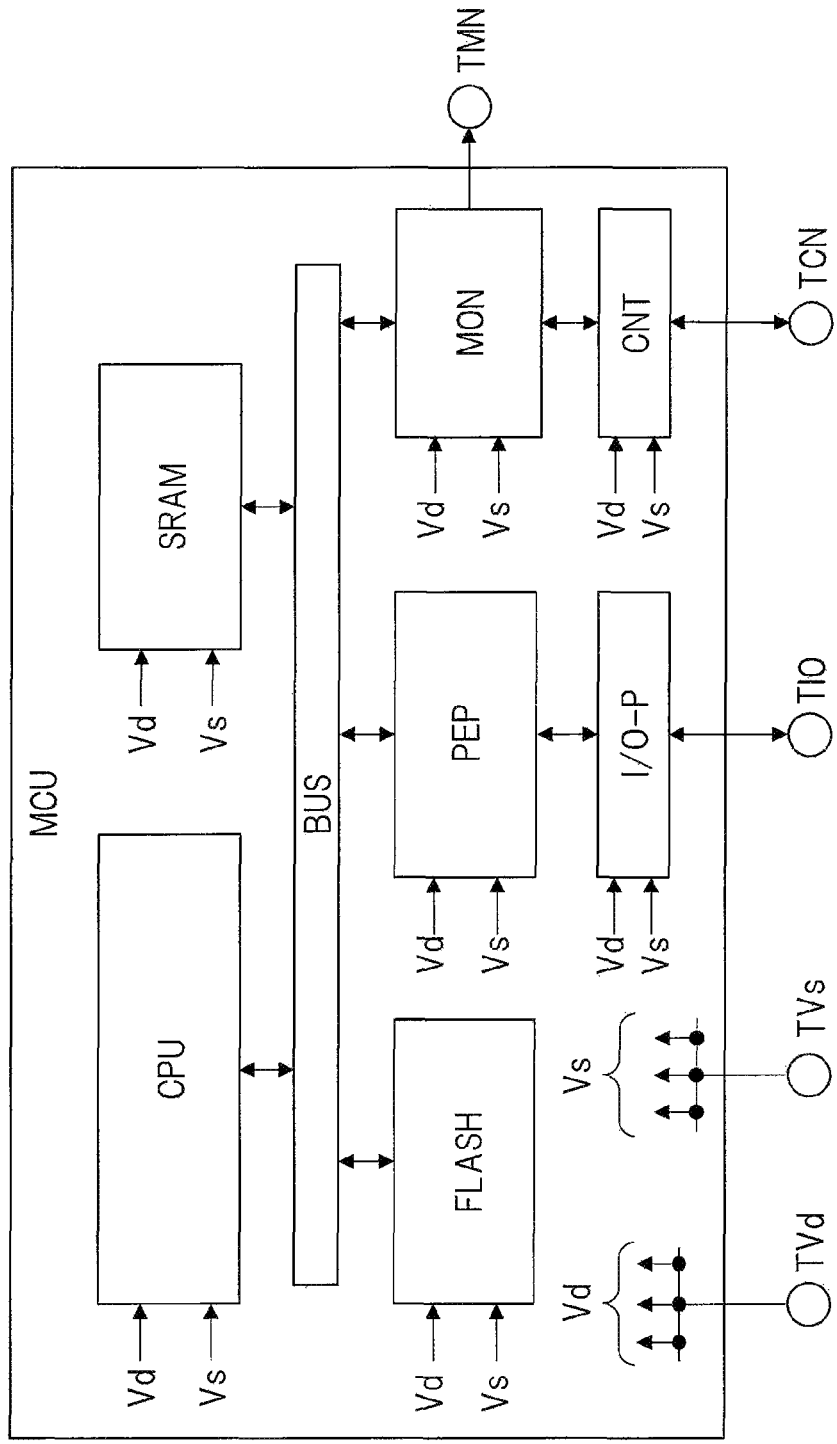
FIG. 1 is a block diagram of a configuration of a semiconductor device according to a first embodiment.

FIG. 1 is a block diagram of a configuration of a semiconductor device according to a first embodiment. In the drawing, a reference character "MCU" indicates the semiconductor device formed on one semiconductor substrate. Although the semiconductor device MCU has a plurality of circuit blocks, FIG. 1 illustrates a part of the plurality of circuit blocks. Regarding the circuit blocks illustrated in FIG. 1, each of the circuit blocks is formed of an insulating gate field effect transistor (hereinafter, also referred to as a MOSFET or simply as a transistor) on the same semiconductor substrate, the insulating gate field effect transistor being formed by a publicly-known semiconductor manufacturing technique although described later. The semiconductor device MCU has a plurality of external terminals for electrically connecting to the outside of the semiconductor device MCU. Some external terminals of the plurality of external terminals are illustrated with circles in FIG. 1.

Circuit blocks CPU, SRAM, FLASH, PEP, MON, I/O-P, and CNT are illustrated in FIG. 1 as the circuit blocks forming the semiconductor device MCU. Here, a reference character "CPU" indicates a central processing circuit, a reference character "RAM" indicates a static memory (a storage circuit), a reference character "FLASH" indicates an electrically rewritable nonvolatile memory (hereinafter, also referred to as a nonvolatile memory), a reference character "PEP" indicates a user circuit, a reference character "I/O-P" indicates an input/output circuit, a reference character "MON" indicates a monitor circuit, and a reference character "CNT" indicates a control circuit. In FIG. 1, a reference character "BUS" indicates a bus, and each of reference characters "TVd", "TVs", "TIO", "TCN", and "TMN" indicates an external terminal. The central processing circuit CPU, the static memory SRAM, the nonvolatile memory FLASH, the user circuit PEP, and the monitor circuit MON are connected to the bus BUS, and they transmit/receive data to/from one another through the bus BUS although not particularly limited.

The nonvolatile memory FLASH includes a plurality of nonvolatile memory cells, and stores a program, data, and others. The central processing circuit CPU reads, for example, the program stored in the nonvolatile memory FLASH and operates in accordance with the read program.

The static memory SRAM includes a plurality of static memory cells (first static memory cells) although described in detail later. For example, the static memory SRAM temporarily stores the data when the central processing circuit CPU executes the program and stores an executed result.

The user circuit PEP is a circuit provided to achieve a function to be desired by a user in the semiconductor device MCU, and is, for example a timer circuit, a counter circuit, a serial communication circuit, an analog/digital conversion circuit, a data transfer circuit, and others. That is, the user circuit PEP is a circuit corresponding to the user. The user circuit PEP is connected to the external terminal (an input/output terminal) TIO through the input/output circuit I/O-P. For example, an input signal supplied to the input/output terminal TIO is supplied to the user circuit PEP through the input/output circuit I/O-P. In the user circuit PEP, the supplied input signal is subjected to a processing corresponding to the function to be desired by the user, and is supplied to, for example, the central processing circuit CPU through the bus BUS as data. To the supplied data, the central processing circuit CPU performs a processing in accordance with the program. The data processed by the central processing circuit CPU is supplied to, for example, the user circuit PEP again, and the user circuit PEP outputs the supplied data, as an output signal, from the input/output terminal TIO through the input/output circuit I/O-P.

Since the monitor circuit MON and the control circuit CNT will be described in detail later, only their outlines will be described here. The monitor circuit MON has a static memory cell (a second static memory cell) having the same configuration as that of the static memory cell included in the static memory SRAM. In accordance with an instruction from the control circuit CNT, the monitor circuit MON applies a stress to the static memory cell included in the monitor circuit MON during a period in which the semiconductor device MCU operates, and outputs a state of the static memory cell from the external terminal TMN.

The plurality of static memory cells forming the static memory SRAM and the static memory cell included in the monitor circuit MON have the same configuration as each other. However, in order to distinguish both of the memory cells, each of the plurality of static memory cells forming the static memory SRAM is referred to as the first static memory cell or simply as a first memory cell. On the other hand, the static memory cell included in the monitor circuit MON is referred to as the second static memory cell or simply as a second memory cell. When there is no need to distinguish both of the static memory cells, both of the static memory cells are simply referred to as static memory cells or memory cells so as to be included therein.

Note that each of the central processing circuit CPU and the user circuit PEP includes a plurality of logic circuits, and thus can be regarded as a logic circuit.

In FIG. 1, the external terminal TVd indicates a power source terminal to which a predetermined power source voltage Vd (a first voltage) is supplied, and the external terminal TVs indicates a power source terminal to which a ground voltage Vs of the circuit is supplied. According to the first embodiment, the power source voltage Vd and the ground voltage Vs are supplied to the central processing circuit CPU, the static memory SRAM, the nonvolatile memory FLASH, the user circuit PEP, the input/output circuit I/O-P, the monitor circuit MON, and the control circuit CNT. These circuit blocks operate with the power source voltage Vd as an operating voltage. Of course, a voltage conversion circuit may be provided in the semiconductor device MCU so that the power source voltage Vd supplied to the power source terminal TVd is dropped or boosted, and the power source voltage acquired by the dropping or the boosting is supplied to these circuit block circuits as the power source voltage Vd by the voltage conversion circuit.

In FIG. 1, the external terminal TCN indicates an external terminal to which the control data is supplied, and the control data supplied to the external terminal TCN is supplied to the control circuit CNT. For example, the control circuit CNT transmits the supplied control data to the monitor circuit MON so as to set the monitor circuit MON.

<Configuration of Monitor Circuit>

Figure 2:
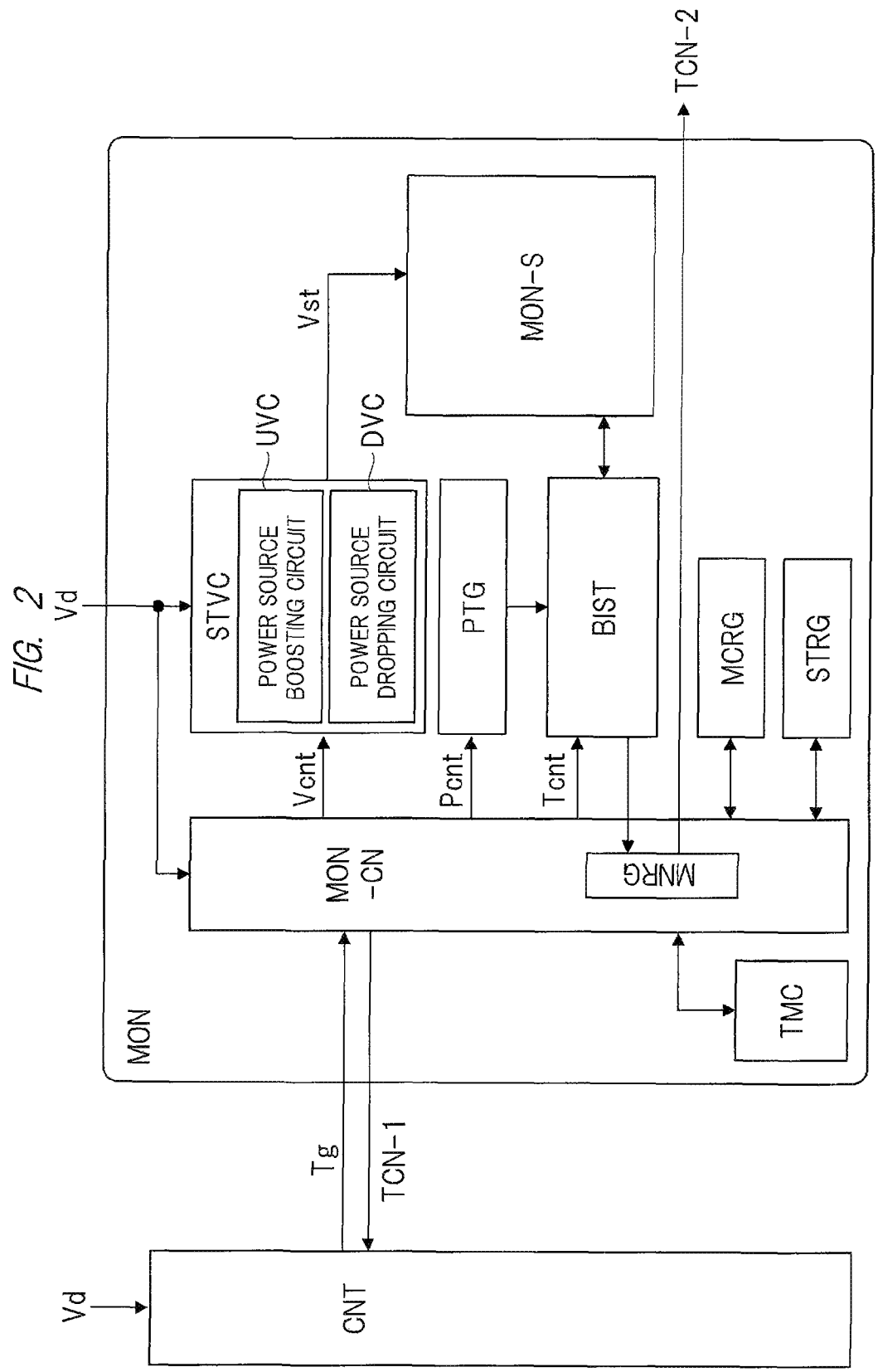
FIG. 2 is a block diagram of a configuration of a monitor circuit according to the first embodiment.

FIG. 2 is a block diagram of a configuration of the monitor circuit MON according to the first embodiment. For the convenience of description, note that FIG. 2 also illustrates the control circuit CNT. In order to avoid a state in which the drawing is complicated, the ground voltage Vs to be supplied to the monitor circuit MON and the control circuit CNT is omitted, and only the power source voltage Vd commonly supplied thereto is clearly illustrated in FIG. 2.

The monitor circuit MON includes a monitor memory circuit MON-S, a stress voltage generating circuit STVC, a pattern generating circuit PTG, a test circuit BIST, a cell original-performance storage register MCRG, a stress time register STRG, a timer circuit TMC, and a monitor control circuit MON-CN. According to the first embodiment, the power source voltage Vd is supplied to the stress voltage generating circuit STVC, the pattern generating circuit PTG, the test circuit BIST, the cell original-performance storage register MCRG, the stress time register STRG, the timer circuit TMC, and the monitor control circuit MON-CN as an operating voltage. To the monitor memory circuit MON-S, a stress voltage Vst (a second voltage) generated by the stress voltage generating circuit STVC is supplied as an operation power source voltage. In order to avoid a state in which the drawing is complicated, note that FIG. 2 clearly illustrates the supply of the power source voltage Vd only for the monitor control circuit MON-CN and the stress voltage generating circuit STVC.

To the stress voltage generating circuit STVC, a voltage control signal Vcnt is supplied from the monitor control circuit MON-CN so as to change a voltage value of the stress voltage Vst formed in accordance with the voltage control signal Vcnt. According to the first embodiment, the stress voltage generating circuit STVC includes a power source boosting circuit UVC and a power source dropping circuit DVC. The power source boosting circuit UVC and the power source dropping circuit DVC selectively operate in accordance with the voltage control signal Vcnt. That is, the monitor control circuit MON-CN instructs the stress voltage generating circuit STVC to apply a stress or perform self-diagnosis by using the voltage control signal Vcnt.

When the instruction for stress application is issued to the stress voltage generating circuit STVC through the voltage control signal Vcnt, the power source boosting circuit UVC in the stress voltage generating circuit STVC operates. The power source boosting circuit UVC boosts the power source voltage Vd, forms a voltage having a voltage value higher than that of the power source voltage Vd, and supplies the formed voltage to the monitor memory circuit MON-S as the stress voltage Vst. On the other hand, when the instruction for self-diagnosis is issued to the stress voltage generating circuit STVC through the voltage control signal Vcnt, the power source dropping circuit DVC in the stress voltage generating circuit STVC operates. The power source dropping circuit DVC drops the power source voltage Vd, forms a voltage having a voltage value lower than that of the power source voltage Vd, and supplies the formed voltage to the monitor memory circuit MON-S as the stress voltage Vst. That is, in accordance with the voltage control signal Vcnt, the stress voltage generating circuit STVC supplies the voltage having a voltage value higher than that of the power source voltage Vd or the voltage having a voltage value lower than that of the power source voltage Vd to the monitor memory circuit MON-S as the stress voltage Vst.

In the present specification, note that a voltage value is expressed with "high" or "low". The "high" means that an absolute value of the voltage value is "large", and the "low" means that the absolute value of the voltage value is "small".

The pattern generating circuit PTG operates in accordance with a test pattern control signal Pcnt from the monitor control circuit MON-CN. The monitor control circuit MON-CN issues an instruction of whether the monitor memory circuit MON-S is to be tested or not by using the test pattern control signal Pcnt. When the test pattern control signal Pcnt assigns the test (diagnosis) of the monitor memory circuit MON-S, the pattern generating circuit PTG generates a test pattern (an operating pattern in the test) for operating the monitor memory circuit MON-S. The test pattern generated by the pattern generating circuit PTG is supplied to the test circuit BIST.

According to the first embodiment, the test circuit BIST has two functions. That is, the test circuit BIST has a stress applying function for operating the monitor memory circuit MON-S and a self-diagnosis function for diagnosing the monitor memory circuit MON-S in accordance with the test pattern supplied from the pattern generating circuit PTG. It is determined which one of the stress applying function and the self-diagnosis function operates by the test control signal Tcnt from the monitor control circuit MON-CN. That is, the stress applying function or the self-diagnosis function operates depending on a case in which the monitor control circuit MON-CN assigns the stress application or the self diagnosis by using the test control signal Tcnt.

The cell original-performance storage resister MCRG is a register that stores data for determining the voltage value of the voltage formed by the power source dropping circuit DVC. The data is set in the cell original-performance storage register MCRG before a semiconductor manufacturer provides the user with the semiconductor device MCU (ships the semiconductor device to the user). For example, in a test process before the shipment, the semiconductor manufacturer examines the second memory cell forming the monitor memory circuit MON-S so as to acquire a lower limit operating voltage with which the second memory cell is operable. The acquired operable lower limit operating voltage is stored in the cell original-performance storage register MCRG as a lower limit original-performance value (data) of the second memory cell.

The lower limit original-performance data stored in the cell original-performance storage register MCRG is supplied to the monitor control circuit MON-CN. The monitor control circuit MON-CN determines the voltage value formed by the power source dropping circuit DVC, based on the supplied lower limit original-performance data. The power source dropping circuit DVC lowers the power source voltage Vd so as to form the voltage value based on the lower limit original-performance data, and therefore, the voltage based on the lower limit original-performance data has a voltage value lower than that of the power source voltage Vd to be supplied to the static memory SRAM or others illustrated in FIG. 1. That is, when the user operates the semiconductor device MCU, the voltage having a voltage value lower than that of the power source voltage Vd to be supplied to the static memory SRAM or others is supplied to the monitor memory circuit MON-S as the stress voltage Vst.

The cell original-performance storage register MCRG may be a volatile memory, but is desirably formed of a nonvolatile memory. For example, the cell original-performance storage register MCRG is formed of an electrically rewritable fuse such as a so-called eFUSE, or an electrically rewritable nonvolatile memory (such as a so-called flash memory). For example, the lower limit original-performance data is set for the cell original-performance storage register MCRG by the supply of the acquired lower limit original-performance data to the monitor circuit MON through the external terminal TCN (FIG. 1) and the control circuit CNT by the semiconductor manufacturer. In this case, the supplied lower limit original-performance data is supplied from the control circuit CNT to the monitor control circuit MON-CN, and besides, is supplied from the monitor control circuit MON-CN to the cell original-performance storage register MCRG, and then is set. This setting corresponds to programming (writing) of the data to the eFUSE or the flash memory when the cell original-performance storage register MCRG is formed of the eFUSE or the flash memory.

The monitor control circuit MON-CN starts the operation in response to a trigger signal Tg from the control circuit CNT. That is, the trigger signal Tg is supplied from the control circuit CNT to the monitor control circuit MON-CN so that the stress application to the monitor memory circuit MON-S starts.

For example, by the supply of the trigger signal Tg, the monitor control circuit MON-CN instructs the stress voltage generating circuit STVC to apply the stress through the voltage control signal Vcnt. The monitor control circuit MON-CN assigns the test to the pattern generating circuit PTG through the test pattern control signal Pcnt, and besides, the monitor control circuit MON-CN assigns the test circuit BIST to operate the stress applying function through the test control signal Tcnt.

Accordingly, the power source boosting circuit UVC operates and supplies the stress voltage Vst having a voltage value higher than that of the power source voltage Vd, to the monitor memory circuit MON-S. At this time, the pattern generating circuit PTG generates the test pattern, and the test circuit BIST accesses the monitor memory circuit MON-S in accordance with the supplied test pattern. Therefore, the monitor memory circuit MON-S operates while using the stress voltage Vst having a voltage value higher than that of the power source voltage Vd as the operating voltage in accordance with the access from the test circuit BIST. When the second memory cell in the monitor memory circuit MON-S is observed at this time, the data is written to and/or read from the second memory cell in accordance with the test pattern in a state in which the stress voltage Vst having a voltage value higher than that of the power source voltage Vd is applied. Therefore, the stress is applied to the second memory cell in the monitor memory circuit MON-S.

After the data writing operation and/or reading operation is performed to the second memory cell in a state in which the stress voltage Vst higher than the power source voltage Vd is applied during a predetermined period, the monitor control circuit MON-CN instructs the stress voltage generating circuit STVC to perform the self-diagnosis through the test pattern control signal Vcnt. The monitor control circuit MON-CN instructs the pattern generating circuit PTG to perform the test through the test pattern control signal Pcnt, and to assign the operation of the self-diagnosis function to the test circuit BIST through the test control signal Tcnt.

Accordingly, the power source dropping circuit DVC operates and supplies the stress voltage Vst having a voltage value lower than that of the power source voltage Vd, to the monitor memory circuit MON-S. The voltage value of the stress voltage Vst at this time is determined by the lower limit original-performance data stored in the cell original-performance storage register MCRG. The test circuit BIST accesses the monitor memory circuit MON-S, writes/reads the data to/from the monitor memory circuit MON-S, and then, diagnoses the monitor memory circuit MON-S. The diagnosis is performed by writing the data into the second memory cell in the monitor memory circuit MON-S, then reading the data, comparing the written data and the read data, determining that a result of the diagnosis is passed when the data is matched with the other data, or determining that the result of the diagnosis is failed when the data is not matched with the other data.

The result of the diagnosis by the test circuit BIST is supplied to the monitor control circuit MON-CN. The monitor control circuit MON-CN includes a diagnosis result register (a retaining circuit) MNRG. The result of the diagnosis by the test circuit BIST is stored in the diagnosis result register MNRG, and the result of the diagnosis stored in the diagnosis result register MNRG is output as a diagnosis result signal TCN-2 from the external terminal TMN illustrated in FIG. 1.

As described above, the monitor control circuit MON-CN applies the stress to the monitor memory circuit MON-S and performs the self-diagnosis when the trigger signal Tg is supplied thereto. The control circuit CNT generates the trigger signal Tg when, for example, the user supplies the power source voltage Vd to the semiconductor device MCU. That is, the trigger signal Tg is generated when the user operates the semiconductor device MCU. Accordingly, when the semiconductor device MCU starts to operate, the stress application and the self-diagnosis are continuously performed to the monitor memory circuit MON-S during a period in which the semiconductor device MCU operates.

However, each of the circuit blocks in the semiconductor device MCU (for example, the user circuit PEP, the static memory SRAM, the central processing circuit CPU, and others illustrated in FIG. 1) does not continuously operate during the period in which the user operates the semiconductor device MCU. That is, a period in which each of the circuit blocks operates is not 100% of the period in which the semiconductor device MCU operates. For example, data writing or reading operation is not continuously performed to the static memory SRAM during the period in which the semiconductor device MCU operates.

According to the first embodiment, when the stress is applied to the monitor memory circuit MON-S, the stress voltage Vst having a voltage value higher than that of the power source voltage Vd is supplied to the monitor memory circuit MON-S as a power source voltage. Therefore, for example, when the static memory SRAM is exemplified, the stress received by the monitor memory circuit MON-S is stronger than stress received by the static memory SRAM during the period in which the semiconductor device MCU operates. In other words, acceleration stress that accelerates the stress in terms of time is applied to the monitor memory circuit MON-S.

Therefore, when the acceleration stress is continuously applied to the monitor memory circuit MON-S during the period in which the semiconductor device MCU operates, it is thought that stress applied is too larger than the stress received by the static memory SRAM during the period in which the semiconductor device MCU operates.

According to the first embodiment, the monitor circuit MON includes the timer circuit TMC although not particularly limited thereto. When the stress is applied to the monitor memory circuit MON-S in accordance with the trigger signal Tg, the monitor control circuit MON-CN performs the control so that the stress is applied to the monitor memory circuit MON-S during a predetermined period (stress application time) by using the timer circuit TMC. For example, the period in which the semiconductor device MCU operates is assumed to be 100%, and the control is performed by using the timer circuit TMC so that the stress is applied to the monitor memory circuit MON-S during a period of 50% that is half of the period.

The period of time in which the stress is applied to the monitor memory circuit MON-S (the stress application time) varies for each type of the semiconductor device provided to the user and/or for each user. Therefore, the stress application time is supplied from the outside of the semiconductor device MCU so as to be set. According to the first embodiment, the stress time register STRG having the same configuration as that of the cell original-performance storage register MCRG is provided to the monitor circuit MON. For example, the stress application time is previously determined by the semiconductor manufacturer before, for example, the user is provided with the semiconductor device MCU, and the semiconductor manufacturer stores the previously-determined stress application time in the stress time register STRG via the external terminal TCN, the control circuit CNT and the monitor control circuit MON-CN during the test process before the shipment of the semiconductor device MCU. The period of time in which the stress is applied is controlled by the period of time measured by the time circuit TMC and the stress application time stored in the stress time register STRG.

When the stress applying function operates in the text circuit BIST, the stress voltage Vst having a voltage value higher than that of the operating power source voltage Vd for operating other circuit blocks (the user circuit PEP, the static memory circuit SRAM, and others) illustrated in FIG. 1 is supplied to the monitor memory circuit MON-S as an operating power source voltage. That is, the data is written/read to/from the second memory cell in the monitor memory circuit MON-S in a state in which the stress voltage Vst having a voltage value higher than that of the power source voltage Vd is supplied as the operating voltage. Accordingly, degradation of characteristics of the second memory cell in the monitor memory circuit MON-S is accelerated in terms of time more than those of the other circuit blocks.

Meanwhile, when the self-diagnosis function operates in the test circuit BIST, the stress voltage Vst having a voltage value lower than that of the operating power source voltage Vd for operating the other circuit blocks illustrated in FIG. 1 is supplied to the monitor memory circuit MON-S as an operating power source voltage. Furthermore, the value of the stress voltage Vst at this time corresponds to the lower limit voltage with which the second memory cell in the monitor memory circuit MON-S is operable. That is, the data is written/read to/from the second memory cell in the monitor memory circuit MON-S in a state in which the stress voltage Vst having a voltage value (a voltage value corresponding to the lower limit voltage) lower than that of the power source voltage Vd is supplied as the operating voltage. Accordingly, in the self-diagnosis, a diagnosis can be performed based on an original performance (the operable lower limit voltage) originally provided to the second memory cell. That is, during the period in which the semiconductor device MCU operates, the acceleration stress that accelerates the degradation of the characteristics in terms of time is applied to the second memory cell in the monitor memory circuit MON-S, and the self-diagnosis based on the provided original performance is performed.

By the operation of the semiconductor device MCU, the time degradation of the characteristics is caused, resulting in a failure in the semiconductor device MCU. According to the first embodiment, in accordance with the period of time in which the semiconductor device MCU operates, the acceleration stress is applied to the second memory cell in the monitor memory circuit MON-S so that the self-diagnosis is performed based on the original performance. Accordingly, the time degradation of the characteristics of the second memory cell can be accurately detected before the failure occurs in the semiconductor device MCU due to the time degradation of the characteristics. As a result, since the time degradation of the characteristics of the second memory cell can be accurately detected before the failure occurs in the semiconductor device MCU due to the time degradation of the characteristics, the failure in the semiconductor device MCU can be predicted or estimated.

According to the first embodiment, each circuit block such as the user circuit PEP, the static memory circuit SRAM, and the central processing circuit CPU illustrated in FIG. 1 is formed of a MOSFET. Similarly, the monitor memory circuit MON-S is also formed of a MOSFET. Even when a MOSFET operates while a voltage lower than its breakdown voltage is supplied thereto, characteristics of the MOSFET temporally change along with time elapses. For example, a gate oxide film of the MOSFET degrades due to the temporal change. A threshold voltage of the MOSFET also changes due to the temporal change. That is, the characteristics of the MOSFET degrade due to the temporal change. In this manner, due to the degradation of the characteristics of the MOSFET, characteristics of each circuit block formed of the MOSFET also degrade. As a result, characteristics of the semiconductor device MCU also temporally change.

The second memory cell in the monitor memory circuit MON-S is formed of the same MOSFET as the MOSFET forming each of the other circuit blocks. According to the first embodiment, the acceleration stress is applied to the second memory cell in the monitor memory circuit MON-S, namely, the MOSFET forming the second memory cell. This manner simulates a state in which the MOSFET forming each of the other circuit blocks operates for a long time while the power source voltage Vd lower than the breakdown voltage is supplied. In the self-diagnosis, a diagnosis is performed in a state in which the operable lower limit original-performance operating voltage is supplied to the second memory cell in the monitor memory circuit MON-S. This corresponds to a diagnosis of whether or not the MOSFET that has operated for a long time under the supply of the power source voltage Vd operates under the operable operating voltage. As a result, the temporal change of the characteristics of each circuit block formed of the MOSFET can be accurately predicted by the test circuit BIST, so that the failure can be predicted.

According to the first embodiment, note that a signal TCN-1 is supplied from the monitor control circuit MON-CN to the control circuit CNT. The data stored in the cell original-performance storage register MCRG, the stress time register STRG, and the diagnosis result register MNRG are supplied to the control circuit CNT as the signal TCN-1. Accordingly, the original-performance lower limit data stored in the cell original-performance storage register MCRG and the stress application time stored in the stress time register STRG can be read from the external terminal TCN illustrated in FIG. 1.

<Static Memory and Monitor Memory Circuit>

Figure 3A:
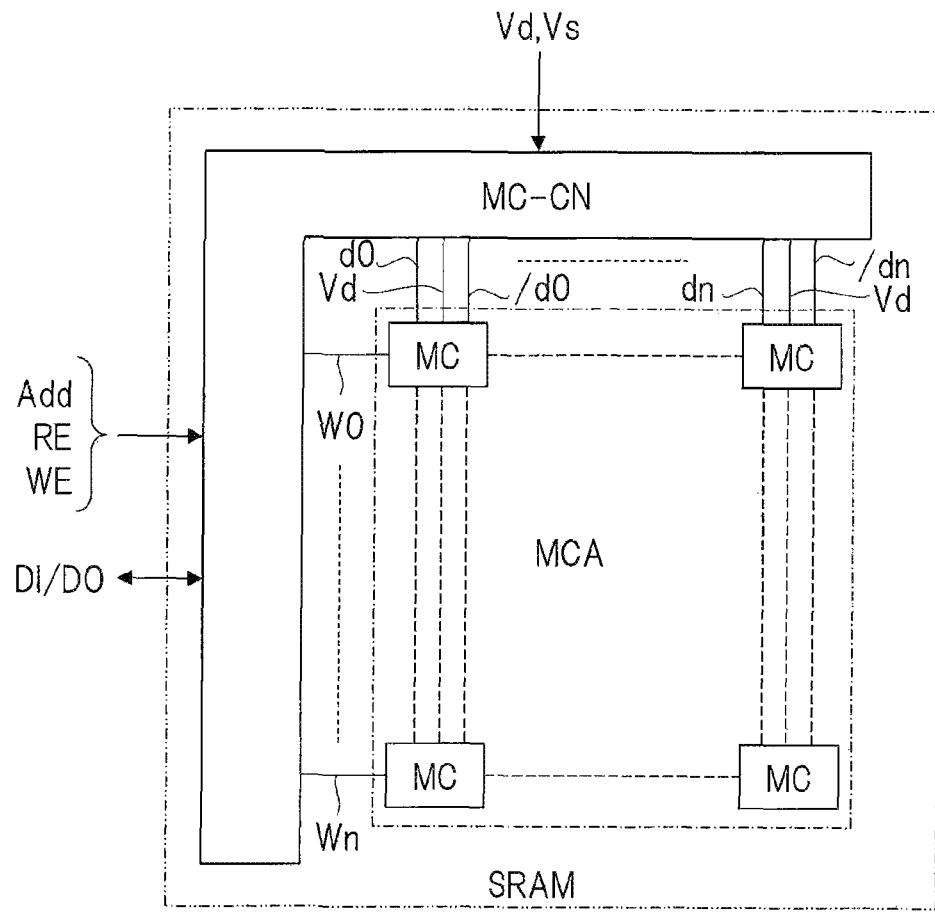
FIGS. 3A and 3B are block diagrams of configurations of a static memory and a monitor memory circuit according to the first embodiment, respectively.
Figure 3B:
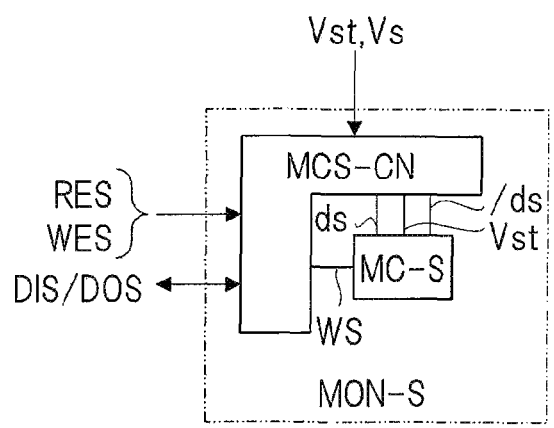

FIGS. 3A and 3B are block diagrams of configurations of the static memory SRAM and the monitor memory circuit MON-S according to the first embodiment, respectively.

<<Configuration of Static Memory>>

FIG. 3A is the block diagram of the configuration of the static memory SRAM. In FIG. 3A, the static memory SRAM includes a memory array MCA and a peripheral circuit MC-CN. The memory array MCA includes a plurality of first memory cells MC, a plurality of data line pairs d0, /d0 to dn, /dn, and a plurality of word lines W0 to Wn. The plurality of first memory cells MC are arranged in a matrix so that the data line pairs d0, /d0 to d0, /dn are arranged in the respective columns, and so that the word lines W0 to Wn are arranged in the respective rows. In the memory array MCA, the plurality of first memory cells MC arranged in each of the rows is connected to the word line arranged in each of the rows. In the memory array MCA, the plurality of first memory cells MC arranged in each of the columns is connected to the data line pair arranged in each of the columns.

In order to prevent the drawing from being complicated, in the memory array MCA, FIG. 3A clearly illustrates only a first memory cell MC arranged in a 0-th row and a 0-th column, a first memory cell MC arranged in the 0-th row and an n-th column, a first memory cell MC arranged in an n-th row and the 0-th column, and a first memory cell MC arranged in the n-th row and the n-th column among the plurality of first memory cells MC arranged in the matrix. While exemplifying these clearly-illustrated first memory cells MC, connection relations among the word lines, the data line pairs, and the first memory cells MC will be described as follows.

In the memory array MCA, the plurality of first memory cells MC arranged in the 0-th row are connected to the word line W0 arranged in the same 0-th row. To the word line Wn arranged in the n-th row, the plurality of first memory cells MC arranged in the same n-th row are also connected. To the data line pair d0, /d0 arranged in the 0-th column, the plurality of first memory cells MC arranged in the 0-th column are connected. To the data line pair dn, /dn arranged in the n-th column, the plurality of first memory cells MC arranged in the n-th column are connected. Similarly, to the word lines W1 to Wn-1 (not illustrated) arranged in the rest of the respective first row to (n-1)th row, the plurality of first memory cells MC (not illustrated) arranged in the same first row to the (n-1)th row are connected. Similarly, to the data line pairs d1, /d1 to dn-1 /dn-1 (not illustrated) arranged in the rest of the respective first column to the (n-1)th column, the plurality of first memory cells MC (not illustrated) arranged in the same first column to the (n-1)th column are connected.

From a different point of view, in the memory array MCA, the first memory cell MC is arranged at each intersection between the word lines W0 to Wn and the data line pairs d0, /d0 to dn, /dn.

Here, the data line pairs d0, /d0 to dn, /dn include pairs of data lines d0 to dn and data lines /d0 to /dn, respectively. When data is read from a first memory cell MC, one data line d0 out of the pair of data lines (for example, d0 and /d0) forming the data line pair changes in a direction of the power source voltage Vd (or in a direction of the ground voltage Vs) and the other data line /d0 changes in the direction of the ground voltage Vs (or in the direction of the power source voltage Vd) in accordance with the data to be read. Similarly, when data is written in the first memory cell MC, the one data line d0 changes in the direction of the power source voltage Vd (or in the direction of the ground voltage Vs) and the other data line /d0 changes in the direction of the ground voltage Vs (or in the direction of the power source voltage Vd) in accordance with the data to be written. That is, during the data reading and writing, the voltages of the data line pair d0, /d0 complementarily change.

To the peripheral circuit MC-CN, an address signal Add, a write-enable signal WE, and a read-enable signal RE are supplied through the bus BUS illustrated in FIG. 1. Data is input into/output to/from the peripheral circuit MC-CN through the bus BUS. In FIG. 3A, the data to be input is denoted with input data DI, and the data to be output is denoted with output data DO. To the peripheral circuit MC-CN, the power source voltage Vd and the ground voltage of the circuit are supplied.

The peripheral circuit MC-CN is connected to the word lines W0 to Wn and the data line pairs d0, /d0 to dn, /dn.

The plurality of first memory cells MC have the same configuration as each other. Since the exemplary configuration of the first memory cell MC will be described in detail later, only an outline will be described here. The first memory cell MC includes a power source voltage node N1 (not illustrated) and a ground voltage node N2 (not illustrated). The ground voltage Vs is supplied to the ground voltage node N2, and the predetermined power source voltage is supplied to the power source voltage node N1. The first memory cell MC operates while taking the predetermined voltage as a power source voltage. As described above, the first memory cell MC is connected to a word line arranged in a row in which this first memory cell MC is arranged, and to a data line pair arranged in a column in which this first memory cell MC is arranged.

When the data is read from the first memory cell MC, for example, a high-level selection signal is supplied from the peripheral circuit MC-CN to the word line connected to this first memory cell MC in a state in which the predetermined power source voltage is supplied to the power source voltage node N1. Accordingly, the voltage of the data line pair changes in accordance with the data stored in this first memory cell MC. Meanwhile, when the data is written in the first memory cell MC, for example, the peripheral circuit MC-CN causes one data line of the data line pair to be at a high level (or at a low level) and causes the other data line to be at the low level (or at the high level) in accordance with the data to be written. The word line is made to be at the high level, so that the data corresponding to a state in which the one data line is made to be at the high level and the other data line is made to be at the low level, is stored in the first memory cell MC.

In the explanation using the first memory cell MC arranged in the 0-th row and the 0-th column illustrated in FIG. 3A, when data is read, the peripheral circuit MC-CN supplies the high-level selection signal to the word line W0. Accordingly, the voltages of the data line pair d0, /d0 are determined in accordance with the data stored in the first memory cell MC. When data is written, the peripheral circuit MC-CN causes the data line d0 to be at the high level and causes the data line /d0 to be at the low level in accordance with the data to be written. At this time, the peripheral circuit MC-CN supplies the high-level selection signal to the word line W0, so that a state in which the data line d0 is made to be at the high level and the data line /d0 is made to be at the low level, is stored in the first memory cell MC. That is, the data is written in the first memory cell MC.

According to the first embodiment, as the predetermined power source voltage, the power source voltage Vd is supplied to a power source voltage node N1 of each of the plurality of the first memory cells MC arranged in the memory array MCA of the static memory SRAM, and the ground voltage Vs of the circuit is supplied to a ground voltage node N2. Note that FIG. 3A illustrates a state in which the power source voltage Vd and the ground voltage Vs are supplied from the peripheral circuit MC-CN to the power source voltage node N1 and the ground voltage node N2 of each of the first memory cells. However, the embodiment is not limited to this state.

The address signal Add, the write-enable signal WE, and the read-enable signal RE, which are supplied to the peripheral circuit MC-CN, are output when, for example, the central processing circuit CPU (FIG. 1) accesses the static memory SRAM. That is, the central processing circuit CPU outputs the address signal Add for assigning one (or a plurality of) first memory cell MC into/from which the data is to be written/read, from the plurality of first memory cells MC included in the static memory SRAM. Here, when the data is written, the central processing circuit CPU causes the write-enable signal WE to be, for example, at the high level. When the data is read, the central processing circuit CPU causes the read-enable signal RE to be at the high level. These signals output from the central processing circuit CPU are supplied to the static memory SRAM through the bus BUS.

The peripheral circuit MC-CN selects a word line assigned with the supplied address signal Add, from the plurality of word lines W0 to Wn, and selects one (or a plurality of) data line pair assigned with the supplied address signal Add, from the plurality of data line pairs d0, /d0 to dn, /dn. The peripheral circuit MC-CN supplies the high-level selection signal to the selected word line. When the write-enable signal WE is at the high level, the peripheral circuit MC-CN supplies the data in the bus BUS to the selected data line pair as input data DI. Accordingly, the data in the bus BUS is written into the first memory cell MC.

On the other hand, when the read-enable signal RE is at the high level, the peripheral circuit MC-CN causes the selection signal for selecting the word line assigned with the address signal Add, to be at the high level, selects the data line pair assigned with the address signal Add, and supplies the data in the selected data line pair to the bus BUS as output data DO. Accordingly, the data is read from the first memory cell.

<<Configuration of Monitor Memory Circuit>>

FIG. 3B is the block diagram of the configuration of the monitor memory circuit MON-S. In FIG. 3B, the monitor memory circuit MON-S includes the second memory cell MC-S and a peripheral circuit MCS-CN. The second memory cell MC-S has the same configuration as that of each of the first memory cells MC included in the static memory SRAM. The peripheral circuit MCS-CN has a configuration similar to that of the peripheral circuit MC-CN included in the static memory SRAM. Here, differences from the static memory SRAM will be mainly described.

First, the second memory cell MC-S will be described. The configuration of the second memory cell MC-S has the same configuration as that of each of the first memory cells MC. However, a predetermined voltage to be supplied to a power source voltage node N1, is different from that of the first memory cells MC. That is, instead of the power source voltage Vd, the stress voltage Vst is supplied to the power source voltage node N1 of the second memory cell MC-S as the predetermined voltage. Note that the ground voltage Vs is supplied to a ground voltage node N2 of the second memory cell MC-S as similar to the first memory cells MC. FIG. 3B also illustrates a state in which the stress voltage Vst and the ground voltage Vs are supplied to the second memory cell MC-S through the peripheral circuit MCS-CN. However, the embodiment is not limited to this state.

To the peripheral circuit MCS-CN, the ground voltage Vs is supplied as similar to the peripheral circuit MC-CN. Meanwhile, as a power source voltage, to the peripheral circuit MCS-CN, the stress voltage Vs instead of the power source voltage Vd is supplied as different from the peripheral circuit MC-CN. Therefore, the peripheral circuit MCS-CN operates while taking the stress voltage Vst as the power source voltage. According to the first embodiment, the monitor memory circuit MON-S has only one second memory cell MC-S as a memory cell although not particularly limited. Therefore, to the peripheral circuit MCS-CN, the address signal Add is not supplied but a write-enable signal (a monitor write-enable signal) WES and a read-enable signal (a monitor read-enable signal) RES are supplied as different from the peripheral circuit MC-CN. In FIG. 3B, a reference character "DIS" indicates input data (monitor input data) to be supplied to the monitor memory circuit MON-S. A reference character "DOS" indicates output data (monitor output data) to be output from the monitor memory circuit MON-S. In FIG. 3B, a reference character "ds, /ds" indicates a data line pair connected to the second memory cell MC-S, and a reference character "WS" indicates a word line connected to the second memory cell MC-S.

The stress voltage Vst to be supplied to the peripheral circuit MCS-CN and the second memory cell MC-S is supplied from the stress voltage generating circuit STVC illustrated in FIG. 2. The write-enable signal WES, the read-enable signal RES, and the input data DIS are supplied from the test circuit BIST illustrated in FIG. 2, and the output data DOS is supplied to the test circuit BIST.

Next, operation of the monitor memory circuit MON-S will be described.

When the test circuit BIST (FIG. 2) performs the stress applying function through the instruction from the monitor control circuit MON-CN (FIG. 2), the data in accordance with the test pattern formed by the pattern generating circuit PTG is supplied from the test circuit BIST to the monitor memory circuit MON-S as the input data DIS. At this time, the test circuit BIST causes the write-enable signal WES to be at the high level in accordance with the above-described test pattern. For example, in accordance with the test pattern, the test circuit BIST periodically causes the write-enable signal WES to be at the high level.

At this time, the power source boosting circuit UVC in the stress voltage generating circuit STVC is operated by the instruction from the monitor control circuit MON-CN. Because of the operation of the power source boosting circuit UVC, the power source voltage Vd is boosted by the power source boosting circuit UVC, a voltage having a voltage value higher than that of the power source voltage Vd is formed, and the stress voltage Vst is supplied to the peripheral circuit MCS-CN and the second memory cell MC-S in the monitor memory circuit MON-S as each operating voltage.

In response to the high-level write-enable signal WES, the peripheral circuit MCS-CN causes the word line WS to be at the high level, and supplies a voltage corresponding to the input data DIS in accordance with the test pattern being supplied at that time, to the data line pair ds, /ds. Accordingly, into the second memory cell MC-S, data corresponding to the input data DIS is written in a state in which the stress voltage Vst is supplied as the operating voltage. In this manner, in accordance with the test pattern, every time the write-enable signal WES supplied to the peripheral circuit MC-CN changes so as to be at the high level, the data corresponding to the input data DIS at that time is written into the second memory cell MC-S to which the stress voltage Vst is being supplied.

When performing the stress applying function, the test circuit BIST causes the read-enable signal RES to be at the high level. For example, after the write-enable signal WES is periodically caused to be at the high level as described above, the text circuit BIST periodically causes the read-enable signal RES to be at the high level. Needless to say, for example, the embodiment is not limited to this, and the test circuit BIST may alternately cause the read-enable signal RES and the write-enable signal WES to be at the high level.

The stress voltage Vst having a voltage value higher than that of the power source voltage Vd is supplied to the peripheral circuit MCS-CN and the second memory cell MC-S in the monitor memory circuit MON-S as each operating voltage.

The peripheral circuit MCS-CN causes the word line WS to be at the high level in response to the high-level read-enable signal RES. Accordingly, the second memory cell MC-S sets the voltage of the data line pair ds, /ds to be a value in accordance with the data stored in the second memory cell MC-S in a state in which the stress voltage Vst is being supplied as the operating voltage. The peripheral circuit MCS-CN outputs the output data corresponding to the voltage of the data line pair ds, /ds. In this manner, the peripheral circuit MCS-CN reads the data from the second memory cell MC-S to which the stress voltage Vst is being supplied every time the read-enable signal RES changes so as to be at the high level.

When the test circuit BIST (FIG. 2) performs the self-diagnosis function through the instruction form the monitor control circuit MON-CN (FIG. 2), the test circuit BIST supplies the input data DIS in accordance with the test pattern formed by the pattern generating circuit PTG, to the monitor memory circuit MON-S, and causes the write-enable signal WES to be at the high level in accordance with the test pattern. At this time, the power source dropping circuit DVC in the stress voltage generating circuit STVC (FIG. 2) operates in accordance with the instruction from the monitor control circuit MON-CN. As described in FIG. 2, the power source dropping circuit DVC drops the power source voltage Vd, and outputs a voltage acquired by the dropping, as the stress voltage Vst. The voltage value of the stress voltage Vst at this time is lower than that of the power source voltage Vd, and is a value determined by the lower limit original-performance data stored in the cell original-performance storage register MCRG.

To the peripheral circuit NCS-CN and the second memory cell MC-S, the stress voltage Vst having the voltage value determined by the lower limit original-performance data is supplied as the operating voltage. That is, the peripheral circuit MCS-CN and the memory cell MC-S operate under a condition in which the stress voltage Vst having a low voltage value is used as a power source voltage.

When the high level write enable signal WES is supplied to the peripheral circuit MCS-CN, the peripheral circuit MCS-CN causes the word line WS to be at the high level in response to this high-level write-enable signal WES, so that the test pattern is written into the second memory cell MC-S as the input data DIS as similar to a case of the stress applying function.

After the input data DIS is written into the second memory cell MC-S, the test circuit BIST causes the read-enable signal RES to be at the high level. In response to this, the peripheral circuit MCS-CN causes the word line WS to be at the high level, so that the output data DOS according to the voltage of the data line pair ds, /ds is output.

When the degradation of the characteristics of the MOSFET forming the second memory cell MC-S does not progress, the degradation of the characteristics of the second memory cell MC-S does not progress, either. Therefore, in the self-diagnosis function, data having the same value as that of the written input data DIS is output as the output data DOS.

The test circuit BIST determines whether the output data DOS supplied from the monitor memory MON-S and the previously-written input data DIS match with each other or not, supplies a result of the determination to the diagnosis result register MNRG, and stores the result of the determination in the diagnosis result register MNRG. The result of the determination stored in the diagnosis result register MNRG is output as the diagnosis result signal TCN-2 to the outside of the semiconductor device MCU (FIG. 1) through the external terminal TMN (FIG. 1).

When the degradation of the characteristics of the second memory cell MC-S does not progress, the same data as the data DIS written into the second memory cell MC-S during the self-diagnosis function is output as the output data DOS. In this case, since the input data DIS and the output data DOS match with each other, data indicating the result is good is supplied from the test circuit BIST to the diagnosis result register MNRG. In this case, a signal indicating that the result is good is output as the diagnosis result signal TCN-2.

On the other hand, when the degradation of the characteristic of the MOSFET forming the second memory cell progresses, the degradation of the characteristics of the second memory cell MC-S also progresses. Therefore, when the word line WS becomes at the high level, the voltage of the data line pair ds, /ds has a voltage value in no relation to the previously-written input data DIS. The peripheral circuit MCS-CN outputs data in accordance with the voltage of the data line pair ds, /ds as the output data DOS. Thus, to the test circuit BIST, the output data DOS in no relation to the previously-written input data DIS is supplied.

The output data DOS and the input data DIS are compared with each other by the test circuit BIST, and the comparison result is determined to be the unmatching. When the comparison result is determined to be the unmatching, the test circuit BIST supplies the result indicating the unmatching to the diagnosis result register MNRG, and stores the result in the diagnosis result register MNRG. The result of the determination stored in the diagnosis result register MNRG is output as the diagnosis result signal TCN-2 to the outside of the semiconductor device MCU (FIG. 1) through the external terminal TMN (FIG. 1).

Here, the explanation has been made about the case in which the monitor memory circuit MON-S includes one second memory cell MC-S. However, the embodiment is not limited to this. That is, to the monitor memory circuit MON-S, a memory array MCA having a plurality of second memory cells MC-S arranged in a matrix may be provided as similar to the static memory cell SRAM. Also in this case, a word line is provided to each row and a data line pair is provided to each column in the arrangement formed of the plurality of second memory cells MC-S.

In this case, the peripheral circuit MCS-CN is made so as to receive an address signal for assigning one or a plurality of second memory cells MC-S from the plurality of second memory cells MC-S, so that a word line and a data line pair are selected in accordance with the address signal as similar to the static memory SRAM. In the stress application, the input data DIS based on a text pattern is written into the second memory cell MC-S assigned by the address signal, and is read as output data DIS. Meanwhile, in the self-diagnosis, at least, the data may be written/read to/from the second memory cell MC-S assigned by the address signal, and the written input data DIS and the read output data DOS may be compared with each other by the test circuit BIST.

In this case, in the stress application, the test circuit BIST forms the address signal to be supplied to and data to be supplied as the input data DIS to the monitor memory circuit MON-S in accordance with the test pattern formed by a pattern generating circuit PTG. On the other hand, in the self-diagnosis, the test circuit BIST forms the address signal and the input data DIS to be supplied to the monitor memory circuit MON-S in accordance with the test pattern formed by the pattern generating circuit PTG so that the writing operation is performed. After that, the test circuit BIST forms an address signal so that the reading operation is performed. During the reading operation, the test circuit BIST compares the output data DOS read from the monitor memory circuit MON-S and the written input data DIS or the test pattern. A result of this comparison is supplied to a diagnosis result register MNRG and then is stored in the diagnosis result register MNRG.

<Circuits of Semiconductor Device>

Figure 4A:
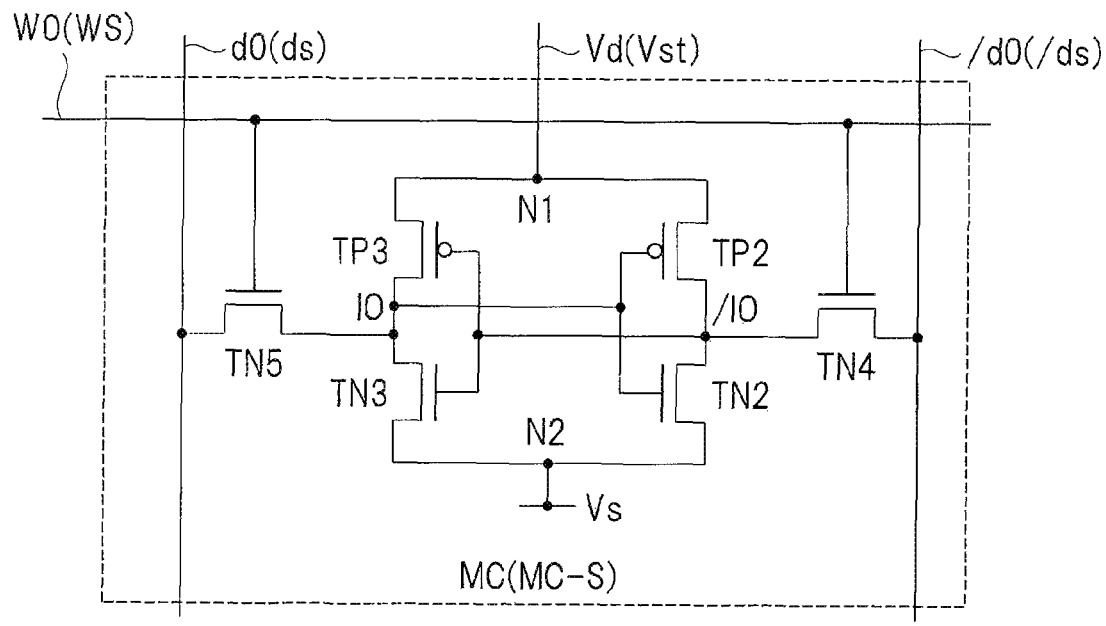
FIGS. 4A and 4B are circuit diagrams of configurations of a logic circuit and a memory cell to be used in the semiconductor device according to the first embodiment, respectively.
Figure 4B:
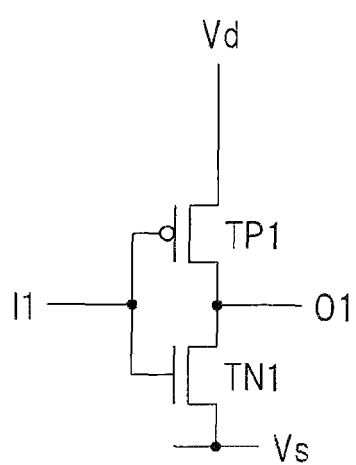

Each of FIGS. 4A and 4B is a circuit diagram of a configuration of a circuit forming the circuit block included in the semiconductor device MCU according to the first embodiment. FIG. 4A is the circuit diagram of the configuration of the static memory cell (a memory cell) illustrated in FIG. 3. FIG. 4B is the circuit diagram of the example of the logic circuit included in each of the central processing circuit CPU, the static memory SRAM, the nonvolatile memory FLASH, the user circuit PEP, and others illustrated in FIG. 1.

Each of the central processing circuit CPU, the static memory SRAM, the volatile memory FLASH, the user circuit PEP, and others illustrated in FIG. 1, includes the plurality of logic circuits. An inverter circuit is illustrated in FIG. 4B as an example of these logic circuits. The inverter circuit includes a P-channel MOSFET (hereinafter, referred to as a PMOS) TP1 and an N-channel MOSFET (hereinafter, referred to as an NMOS) TN1. A source of the PMOS TP1 is connected to the power source voltage Vd, and a source of the NMOS TN1 is connected to the ground voltage Vs. A drain of the PMOS TP1 and a drain of the NMOS TN1 are connected in common and are connected to an output node O1. A gate of the PMOS TP1 and a gate of the NMOS TN1 are connected in common, and are connected to an input node I1. The inverter circuit formed of the PMOS TP1 and the NMOS TN1 inverts a phase of a signal supplied to the input node I1, and outputs the inverted signal from the output node O1.

The NMOS TN1 includes, for example, a pair of N-type semiconductor regions formed apart from each other in the semiconductor substrate, a gate oxide film arranged between the pair of N-type semiconductor regions on a main surface of the semiconductor substrate, and a gate electrode arranged on the gate oxide film. Here, the pair of N-type semiconductor regions function as a source and a drain, and the gate electrode functions as a gate. The PMOS TP1 includes a pair of P-type semiconductor regions formed apart from each other in a well region formed in the above-described semiconductor substrate, a gate oxide film arranged on a main surface of the well, and a gate electrode arranged on the gate oxide film. Also here, the pair of P-type semiconductor regions function as a source and a drain, and the gate electrode functions as a gate.

When, for example, a periodic signal is supplied to the input node I1, the NMOS TN1 and the PMOS TP1 are alternately turned ON/OFF. By the operation for turning the NMOS TN1 and the PMOS TP1 ON/OFF, for example, degradation of characteristics of each of the gate oxide films progresses as time elapses. When the gate oxide films degrade, for example, threshold voltages of the PMOS TP1 and the NMOS TN1 are shifted.

By the change of the threshold voltages of the PMOS TP1 and the NMOS TN1, a logical threshold voltage of the inverter circuit is changed. That is, the characteristics of the inverter circuit also degrade. When the characteristics of the inverter circuit degrades to change the logical threshold voltage, for example, an output signal to be output from the output node O1 does not change at an appropriate timing with respect to the change of the signal supplied to the input node I1. Accordingly, the performance of the semiconductor device MCU is degraded or has a failure.

According to the first embodiment, as described in FIGS. 3A and 3B, the first memory cell MC forming the static memory SRAM and the second memory cell MC-S forming the monitor memory circuit MON-S have the same configuration as each other, and this circuit configuration is illustrated in FIG. 4A. In FIGS. 4A and 4B, a reference character in parentheses indicates a reference character relating to the second memory cell MC-S illustrated in FIG. 3B, and a reference character put in front of the parentheses indicates a reference character relating to the first memory cells MC illustrated in FIG. 3A.

In FIG. 4A, the memory cell MC (MC-S) includes PMOSs TP2 and TP3 and NMOSs TN2 to TN5.

A source of each of the PMOSs TP2 and TP3 is connected to a power source voltage node N1, and a source of each of the NMOSs TN2 and TN3 is connected to a ground voltage node N2. A drain of each of the PMOS TP2 and the NMOS TN2 is connected to an input/output node /IO in common, and a drain of each of the PMOS TP3 and the NMOS TN3 is connected to an input/output node IO in common. A gate of each of the PMOS TP2 and the NMOS TN2 is connected to the input/output node IO in common, and a gate of each of the PMOS TP3 and the NMOS TN3 is connected to the input/output /IO in common.

A first inverter circuit connected between the power source voltage node N1 and the ground voltage node N2 can be considered to be configured by the PMOS TP2 and the NMOS TN2. Similarly, a second inverter circuit connected between the power source voltage node N1 and the ground voltage node N2 can be considered to be configured by the PMOS TP3 and the NMOS TN3. In such consideration, inputs and outputs of a pair of inverter circuits (the first inverter circuit and the second inverter circuit) are cross-connected, so that a so-called flip-flop circuit can be considered to be configured. In this case, the first inverter circuit, the second inverter circuit, and the flip-flop circuit operate while taking the predetermined voltage to be supplied to the power source voltage node N1 as an operating voltage.

A source-drain path of the NMOS TN4 is connected between the input/output node /IO and the data line /d0 (/ds) arranged in the same column as that of this memory cell MC (MC-S), and a gate thereof is connected to the word line W0 (WS). The word line W0 is a word line arranged in the same row as that of the memory cell MC (MC-S). Similarly, a source-drain path of the NMOS TN5 is connected between the input/output node IO and the data line d0 (ds) arranged in the same column as that of the memory cell MC (MC-S), and a gate thereof is connected to the word line W0 (WS). The NMOSs TN4 and TN5 are controlled so as to be turned ON/OFF by the voltage of the word W0 (WS). When the word line W0 (WS) is at the high level, they are turned ON so that the input/output nodes IO, /IO and the data lines d0 (ds), /d0 (/ds) are electrically connected to each other.

The data line pair d0 (ds), /d0 (/ds) and the input/output nodes IO, /IO are electrically connected to each other by supplying the high level to the word line W0 (WS) in a state in which the predetermined voltage is supplied to the power source voltage node N1. Thus, in data writing, a complementary voltage in accordance with the data to be written is supplied to the data line pair d0 (ds), /d0 (/ds), so that this complementary voltage is transmitted to the input/output nodes IO and /IO of the flip-flop circuit, and the flip-flop circuit is set in a state in accordance with the data. That is, the data is written in the memory cell MC (MC-S). The word line W0 (WS) is made so as to be at the low level so that the NMOSs TN4 and TN5 are turned OFF, so that the flip-flop circuit retains the state. On the other hand, the high level is supplied to the word line W0 (WS) and then the voltage of the data line pair d0 (ds), /d0 (ds) is detected, so that a voltage in accordance with a state of the flip-flop circuit at that time can be obtained. That is, the data stored (saved) in the memory cell MC (MC-S) can be read.

According to the first embodiment, the power source voltage Vd is supplied to the power source voltage node N1 of each of the first memory cells MC (the plurality of memory cells MC) included in the static memory SRAM as the predetermined voltage. Note that the ground voltage Vs is supplied to the ground voltage node N2.

On the other hand, to a power source voltage node N1 of the second memory cell MC-S included in the monitor memory circuit MON-S, the stress voltage Vst having a voltage value higher than that of the power source voltage Vd is supplied as the predetermined voltage during a period in which the stress applying function operates in the test circuit BIST. During a period in which the self-diagnosis function operates in the test circuit BIST, the stress voltage Vst having a voltage value which is lower than that of the power source voltage Vd and which is determined by the lower limit original-performance value stored in the cell original-performance storage register MCRG is supplied to the power source voltage node N1 of the second memory cell MC-S as the predetermined voltage.

Note that the ground voltage Vs is supplied to a ground voltage node N2 of the second memory cell MC-S included in the monitor memory circuit MON-S regardless of the voltage value of the stress voltage Vst to be supplied to the power source voltage node N1 although not particularly limited thereto. In the present specification, the power source voltage node N1 in the first memory cell MC is referred to as a first voltage node, the power source voltage node N1 in the second memory cell MC-S is referred to as a second voltage node, and the ground voltage node N2 in the memory cell is referred to as reference voltage node in some cases.

To the peripheral circuit MC-CN included in the static memory SRAM, the power source voltage Vd is supplied as the operating voltage. Therefore, the peripheral circuit MC-CN causes the power source voltage Vd to be at the high level to be supplied to the word lines W0 to Wn, although not particularly limited to this. That is, in the static memory SRAM, the high level to be supplied to the word lines is the power source voltage Vd.

When the data is written in the first memory cell MC, the peripheral circuit MC-CN supplies the power source voltage Vd to the data line d0 (or /d0) and supplies the ground voltage Vs to the data line /d0 (or d0) in accordance with the data to be written. On the other hand, when the data is read from the first memory cell MC, the data lines d0, /d0 change between the power source voltage Vd and the ground voltage Vs in accordance with the data to be read.

Meanwhile, to the peripheral circuit MCS-CN included in the monitor memory circuit MON-S, the stress voltage Vst is supplied as the operating voltage. Therefore, when the stress applying function operates in the test circuit BIST, the high level to be supplied to the word line WS becomes the stress voltage Vst having a voltage value higher than that of the power source voltage Vd formed by the power source boosting circuit UVC, although not particularly limited to this. On the other hand, when the self-diagnosis function operates in the test circuit BIST, the high level to be supplied to the word line WS becomes the stress voltage Vst having a voltage value, lower than that of the power source voltage Vd formed by the power source dropping circuit DVC.

During a period in which the stress applying function operates, when the data is written in the second memory cell MC-S, the peripheral circuit MCS-CN supplies the stress voltage Vst to the data line d0 (or /d0) and supplies the ground voltage Vs to the data line /d0 (or d0) in accordance with the data to be written. The stress voltage Vst at this time has a voltage value higher than that of the power source voltage Vd. On the other hand, during a period in which the self-diagnosis function operates, when the data is written in the second memory cell MC-S, the peripheral circuit MCS-CN supplies the stress voltage Vs to the data line d0 (or /d0) and supplies the ground voltage Vs to the data line /d0 (or d0) in accordance with the data to be written. The stress voltage Vst at this time has a voltage value lower than that of the power source voltage Vd.

Each of the PMOSs TP2 and TP3 and the NMOSs TN2 to TN5 included in the memory cell MC (MC-S) has the same configuration as that of each of the PMOS TP1 and the NMOS TN1 illustrated in FIG. 4B. That is, each of the NMOSs TN2 to TN5 has a pair of N-type semiconductor regions formed in the semiconductor substrate on which the NMOS TN1 is formed, a gate insulating film formed between the pair of N-type semiconductor regions on the main surface of the semiconductor substrate, and a gate electrode formed on the gate insulating film. Similarly, each of the PMOS TP2 and TP3 has a pair of P-type semiconductor regions formed in a well formed in the semiconductor substrate on which the NMOS TN1 is formed, a gate insulating film formed between the pair of P-type semiconductor regions on a main surface of the well, and a gate electrode formed on the gate insulating film.

Therefore, the NMOS TN1 included in the logic circuit, the NMOSs TN2 to TN5 included in the first memory cell MC, and the NMOSs TN2 to TN5 included in the second memory cell MC-S have similar characteristics to one another. Similarly, the PMOS TP1 included in the logic circuit, the PMOSs TP2 and TP3 included in the first memory cell MC, and the PMOSs TP2 and TP3 included in the second memory cell MC-S also have similar characteristics to one another.

Accordingly, the writing operation and the reading operation are performed to the second memory cell MC-S in a state in which the stress voltage Vst having a voltage value higher than that of the power source voltage Vd is supplied to the second memory cell MC-S, so that the degradation of the characteristics of the MOSFETs (the PMOSs and the NMOSs) caused when the logic circuit and the first memory cell MC have operated at the power source voltage Vd for a long time can be simulated for a short time.

According to the first embodiment, to the memory cell MC-S, the stress voltage Vst as a voltage lower than the power source voltage Vd and corresponding to the lower limit original-performance value is supplied. Accordingly, failures can be predicted at a timing earlier than a timing of occurrence of the failures of the logic circuit and the first memory cell MC.

<Operation of Semiconductor Device>

Figure 5:
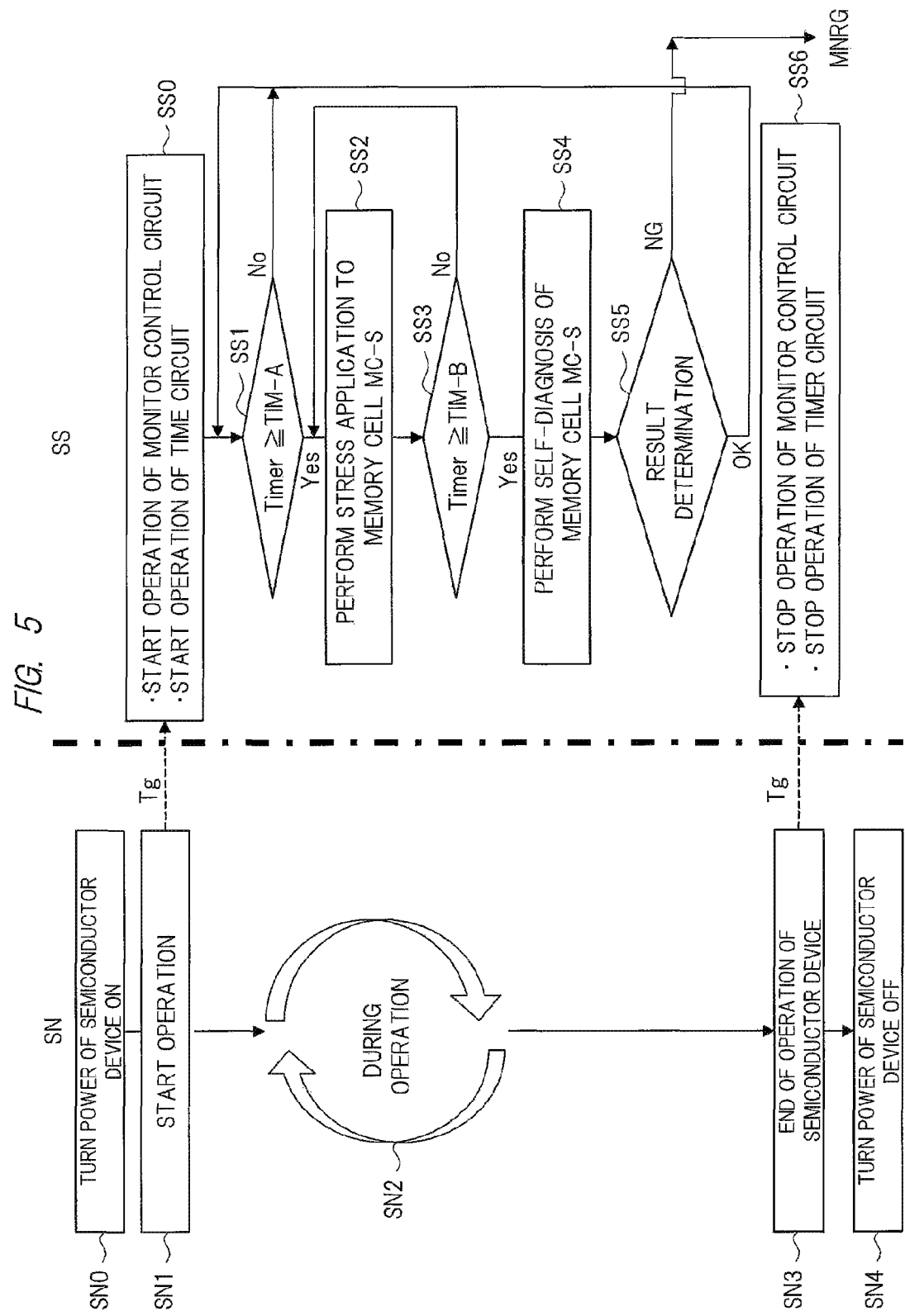
FIG. 5 is a flowchart of operation of the semiconductor device according to the first embodiment.

FIG. 5 is a flowchart of operation of the semiconductor device MCU according to the first embodiment. The monitor circuit MON illustrated in FIG. 1 operates temporally in parallel to other circuit blocks embedded in the semiconductor device MCU. As the other circuit blocks described here, the central processing circuit CPU, the static memory SRAM, the user circuit PEP and others illustrated in FIG. 1 except for the monitor circuit MON are cited.

These other circuit blocks operate in accordance with a flowchart SN illustrated on the left side of a dot-and-dash line in FIG. 5, and the monitor circuit MON operates in accordance with a flowchart SS illustrated on the right side of the dot-and-dash line. The flowchart SN includes steps SN0 to SN4 described below, and the flowchart SS includes steps SS0 to SS6 described below.

In the semiconductor device MCU provided from the semiconductor manufacturer to the user, in order to achieve a function of the semiconductor device MCU, the user supplies the power source voltage Vd and the ground voltage Vs from a power source device (a power source device for the semiconductor device) provided on the outside of the semiconductor device MCU, to the external terminals (the power source terminals) TVd and TVs illustrated in FIG. 1. This corresponds to step SN0 (of turning the semiconductor device ON) in FIG. 5. To the semiconductor device MCU, the power source voltage Vd and the ground voltage Vs are supplied, so that the semiconductor device MCU operates at step SN1 (the operation start in FIG. 5). When the operation starts, the control circuit CNT illustrated in FIG. 2 generates the trigger signal Tg (asserts the trigger signal Tg) so as to activate the monitor circuit MON-CN.

Meanwhile, the central processing circuit CPU, the non-volatile memory FLASH, the static memory, the user circuit PEP, and others, which are the other circuit blocks, start to operate at step SN1, and operate so as to achieve the function desired by the user at step SN2. At step SN2, in order to achieve the function desired by the user, the other circuit blocks continuously operate. Therefore, in FIG. 5, a wording "during operation" is described in step SN2.

When the function desired by the user is achieved, the other circuit blocks end the operation at step SN3. At this time, the control circuit CNT generates the trigger signal Tg (negates the trigger signal Tg) so as to stop the monitor circuit MON-CN. After that, the user stops supplying the power source voltage Vd and the ground voltage Vs to the external terminals TVd and TVs at step SN4 (of turning the semiconductor device OFF in FIG. 5).

In this manner, according to the first embodiment, in order to achieve the function desired by the user, the trigger signal Tg is asserted in synchronization with a timing of the start of the operations of the other circuit blocks, and then, the trigger signal Tg is negated when the desired function is achieved.

The trigger signal Tg is asserted, so that the monitor circuit MON starts the operation in parallel to the operations of the other circuit blocks to perform steps SS0 to SS5 are performed. The trigger signal Tg is negated, so that the monitor circuit MON stops the operation. That is, when the power source voltage Vd is supplied to the semiconductor device MCU, the other circuit blocks operate, and the monitor circuit MON also operates in parallel to this operation.

First, when the trigger signal Tg is asserted, the monitor control circuit MON-CN (FIG. 2) starts the operation. When the operation starts, the monitor control circuit MON-CN starts operation of the timer circuit TMC (step SS0).

According to the first embodiment, two pieces of stress time data TIM-A and TIM-B are stored as the stress application time to be stored in the stress time register STRG (FIG. 2). The semiconductor manufacturer previously stores the two pieces of stress time data TIM-A and TIM-B in the stress time register STRG. Here, the stress time data TIM-A is data for determining a period of time from the assertion of the trigger signal Tg to the start of the stress application, and the stress time data TIM-B is data for determining a period of time during the stress application.

By the two pieces of stress time data TIM-A and TIM-B, the start time of the stress application and the time during the stress application can be determined. It is assumed that a period of time in which the power is supplied to the semiconductor device MCU to operate the semiconductor device MCU is defined as 100%, and that a period of time in which the other circuit blocks (the SRAM, the CPU and others) operate is defined as, for example, a half period (50%) of the period (100%) in which the semiconductor device MCU operates. According to the first embodiment, the pieces of stress time data TIM-A and TIM-B are set so that the stress is applied to the monitor memory circuit MON-S during the half period (50%) of this period, namely, during the same period as the period (50%) in which the other circuit blocks operate based on the period (100%) in which the power is supplied to the semiconductor device MCU. Needless to say, the period of the stress application can be appropriately set by changing the pieces of stress time data TIM-A and TIM-B, although not limited to the period of 50%.

At step SS1, the monitor control circuit MON-CN compares the period of time indicated by the stress time data TIM-A stored in the stress time register STRG and measurement time (Timer) measured by the timer circuit TMC. Step SS1 repeats until the measurement time (Timer) reaches the period of time indicated by the stress time data TIM-A. That is, only the time measurement by the timer circuit TMC is performed. During this period, the reading operation and the writing operation are not performed to the second memory cell MC-S in the monitor memory circuit MON-S.

On the other hand, when the measurement time reaches the period of time indicated by the stress time data TIM-A (Yes), the monitor control circuit MON-CN performs step SS2 next.

That is, the monitor control circuit MON-CN operates the power source boosting circuit UVC by using the voltage control signal Vcnt, operates the pattern generating circuit PTG by using the test pattern control signal Pcnt, and operates the stress applying function in the test circuit BIST by using the test control signal Tcnt. Accordingly, to the monitor memory circuit MON-S, the stress voltage Vst having a voltage value higher than that of the power source voltage Vd is supplied as the operating voltage, and the input data DIS (FIG. 3) and the write-enable signal WES (FIG. 3) in accordance with the test pattern formed by the pattern generating circuit PTG are supplied, so that the input data DIS is written in the monitor memory circuit MON-S. In accordance with the test pattern, the read-enable signal RES (FIG. 3) is supplied to the monitor memory circuit MON-S, and the output data DOS is read from the monitor memory circuit MON-S. As a result, the writing operation and the reading operation are performed to the second memory cell MC-S in the monitor memory circuit MON-S in a state in which the stress voltage Vst having a voltage value higher than that of the power source voltage Vd is supplied, so that the stress is applied to the second memory cell MC-S.

Following step SS2, the monitor control circuit MON-CN performs step SS3. The monitor control circuit MON-CN compares the period of time indicated by the stress time data TIM-B stored in the stress time register STRG and measurement time (Timer) measured by the timer circuit TMC. Steps SS2 and SS3 repeat until the measurement time (Timer) reaches the period of time indicated by the stress time data TIM-B. That is, until the measurement time reaches the period of time indicated by the stress time data TIM-B, the writing operation and the reading operation are performed to the second memory cell MC-S in a state in which the stress voltage Vst having a voltage value higher than that of the power source voltage Vd is supplied, so that the stress is continuously applied.

On the other hand, when the measurement time reaches the period of time indicated by the stress time data TIM-B (Yes), the monitor control circuit MON-CN performs step SS4 next.

At step SS4, the monitor control circuit operates the power source dropping circuit DVC by using the voltage control signal Vcnt, operates the pattern generating circuit PTG by using the test pattern control signal Pcnt, and operates the self-diagnosis function in the test circuit BIST by using the test control signal Tcnt. Accordingly, to the monitor memory circuit MON-S, the stress voltage Vst having a voltage value lower than that of the power source voltage Vd is supplied as the operating voltage. At this time, from the test circuit BIST, the write-enable signal WES (FIG. 3) is supplied to the monitor memory circuit MON-S. As a result, the writing operation is performed to the second memory cell MC-S in the monitor memory circuit MON-S in a state in which the stress voltage Vst having a voltage value lower than that of the power source voltage Vd is supplied. After that, from the test circuit BIST, the read-enable signal RES (FIG. 3) is supplied to the monitor memory circuit MON-S. As a result, the reading operation is performed to the second memory cell MC-S in the monitor memory circuit MON-S in a state in which the stress voltage Vst having a voltage value lower than that of the power source voltage Vd is supplied. The read data is supplied to the test circuit BIST as the output data DOS (FIG. 3), and is compared with the previously written input data DIS. A result of the comparison is stored in the diagnosis result register MNRG in the monitor control circuit MON-CN.

At step SS5, the monitor control circuit MON-CN determines the result stored in the diagnosis result register MNRG. When a result of the determination passes (OK), the timer circuit TMC is reset and then step SS1 is performed. When the result of the determination fails (NG), the diagnosis result signal TCN-2 notifies the outside of the semiconductor device MCU of the fail.

When the result of the determination passes, the above-described steps SS1 to SS5 are repeatedly performed. Therefore, the stress application and the self-diagnosis are repeated with a cycle having the period of time indicated by the stress time data TIM-A. In each cycle, the period of time of the stress application is assigned by the stress time data TIM-B. Accordingly, the stress can be applied and the self-diagnosis can be performed during an appropriate period of time during the period in which the other circuit blocks operate.

When the trigger signal Tg is negated, the monitor control circuit MON-CN stops the operation at step SS6. At this time, the timer circuit TMC also stops the operation. That is, when the result of the determination passes at step SS5, the stress application and the self-diagnosis are repeated in predetermined cycles (the pieces of stress time data TIM-A+TIM-B) until the operation of the semiconductor device MCU ends.

Note that the control circuit CNT (FIGS. 1 and 2) has a so-called JTAG function. By using the JTAG function, the semiconductor manufacturer stores the pieces of stress time data TIM-A and TIM-B and the lower limit original-performance value (the lower limit original-performance data) in the stress time register STRG and the cell original-performance storage register MCRG before the semiconductor device MCU is shipped from the semiconductor manufacturer, such as in the test process. Therefore, the user does not need to be aware of the storage of the pieces of stress time data TIM-A and TIM-B and the lower limit original-performance data or others into the registers.

<Operation of Self-Diagnosis>

Figure 6:
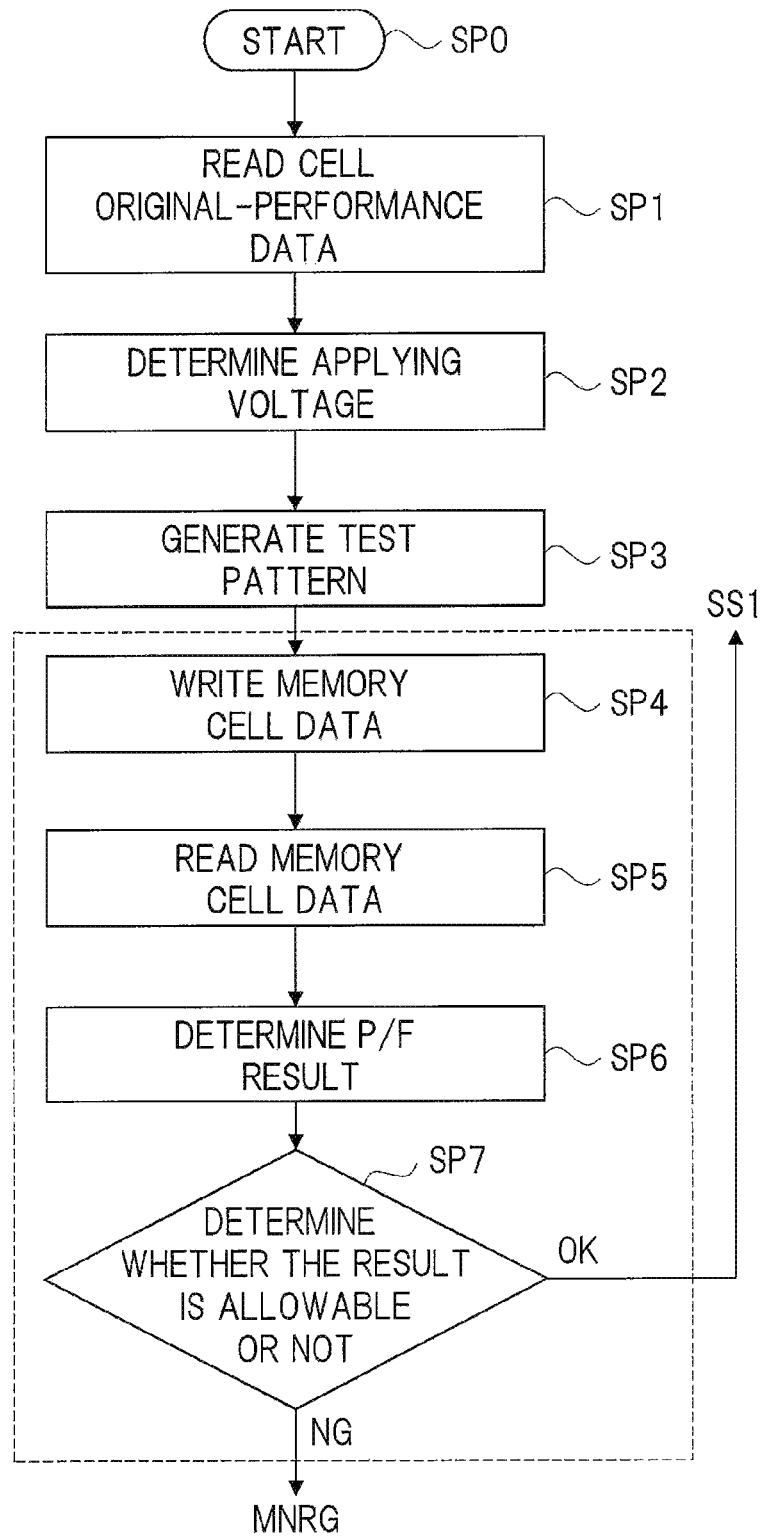
FIG. 6 is a flowchart of operation of a self-diagnosis function according to the first embodiment.

FIG. 6 is a flowchart for describing the step SS4 illustrated in FIG. 5 in detail. In FIG. 6, steps surrounded with a broken line indicate steps performed by the test circuit BIST illustrated in FIG. 2 as the self-diagnosis function.

First, at step SP0, the process starts. Next, at step SP1, the monitor control circuit MON-CN reads the lower limit original-performance data, which is the cell original-performance data, from the cell original-performance storage register MCRG. As described above, the semiconductor manufacturer previously acquires this lower limit original-performance data, and stores it in the cell original-performance storage register MCRG.

Next, in the power source dropping circuit DVC, the monitor control circuit MON-CN determines the voltage value of the stress voltage Vst to be formed from the power source voltage Vd based on the read lower limit original-performance data. Here, in consideration of an allowable margin for the degradation of the characteristics of the MOSFET or others, a slightly-moderated voltage value is determined as the stress voltage Vst. Needless to say, the voltage value of the stress voltage Vst is a value under a condition which is severer than a standard range of the semiconductor device MCU.

Next, at step SP3, the monitor control circuit MON-CN generates the test pattern control signal Pcnt, and generates the test pattern in the pattern generating circuit PTG. The test pattern is supplied to the test circuit BIST. The test circuit BIST supplies and writes the data based on the supplied test pattern, to and in the monitor memory circuit MON-S at step SP4. Next, at step SP5, the test circuit BIST reads the data from the monitor memory circuit MON-S. After that, at step SP6, the test circuit BIST compares the data written at step SP4 and the data read at step SP5 so as to determine that the result either passes or fails. In accordance with a result of the determination at step SP6, a step to be performed next is determined at step SP7. That is, when the result passes (OK), the process returns to step SS1 described in FIG. 5. When the result fails (NG), the diagnosis result is stored in the diagnosis result register MNRG. At SP6, note that the data read at step SP5 and the test pattern generated at step SP3 may be compared with each other.

Figure 12:
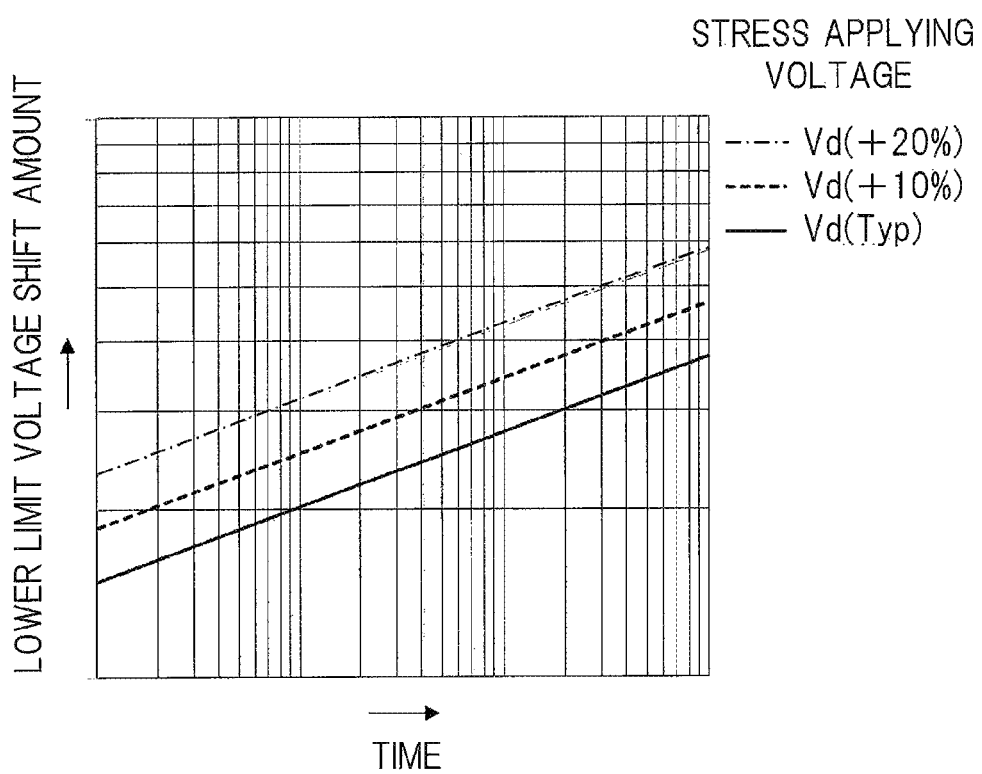
FIG. 12 is a characteristic diagram for describing the first embodiment.

FIG. 12 is a characteristic diagram illustrating a lower limit operating voltage at which the MOSFET is operable. In FIG. 12, a horizontal axis represents time, and a vertical axis represents a shift amount of the lower limit voltage. In the drawing, a solid line indicates change (temporal change) of the lower limit operating voltage shift amount with respect to the elapsed time when the reference (Typ) operating voltage Vd is applied to the MOSFET. A broken line indicates temporal change of the lower limit operating voltage shift amount caused when a voltage higher than the reference operating voltage by 10% is applied to the MOSFET as the operating voltage Vd, and a dot-and-dash line indicates temporal change of the lower limit operating voltage shift amount caused when a voltage higher than the reference operating voltage by 20% is applied to the MOSFET as the operating voltage Vd.

From FIG. 12, it can be understood that the lower limit operating voltage shift amount of the MOSFET, namely, the characteristics thereof degrade as the time elapses. Also, it can be understood that the degradation is increased by the increase in the operating voltage.

Figure 13:
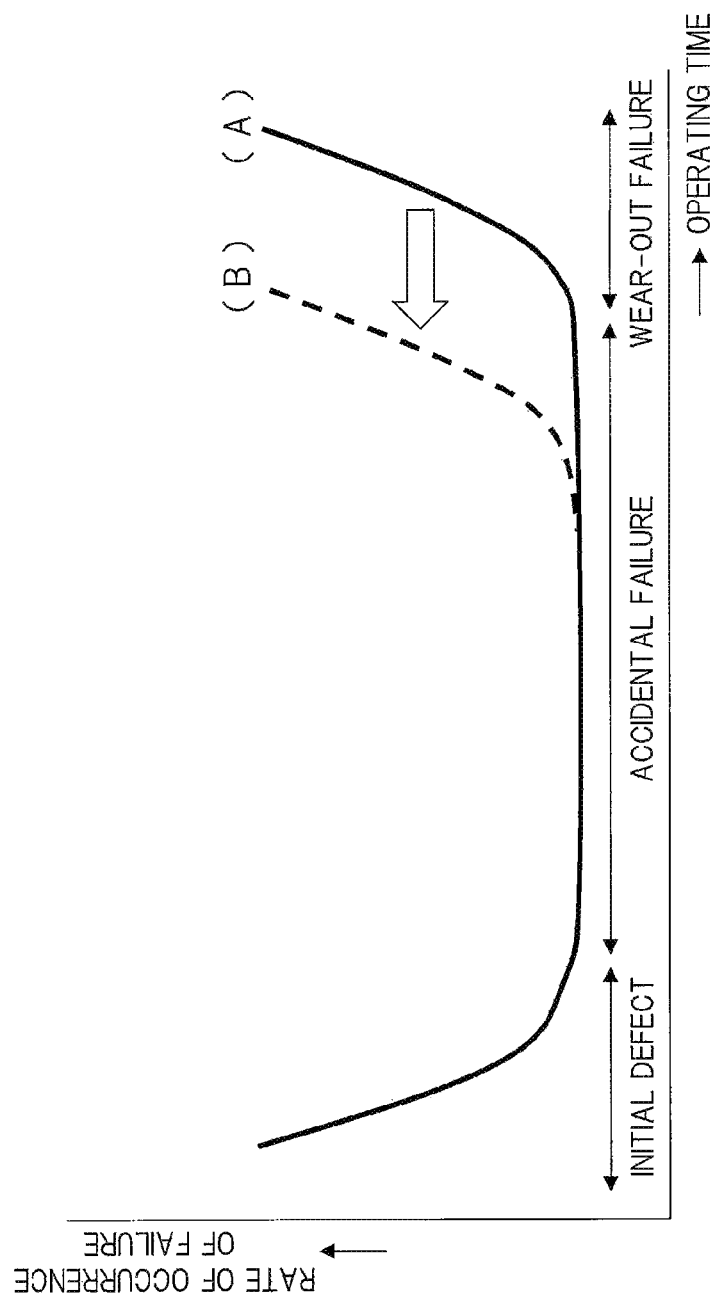
FIG. 13 is a characteristic diagram for describing the first embodiment.

FIG. 13 is a characteristic diagram illustrating bathtub curves of the semiconductor device. The semiconductor device typically has a 10-year warranty. Therefore, in the bathtub curves illustrated in FIG. 13, it is required in reliability evaluation of the semiconductor device to verify that a period until start of a wear-out failure (a product life) is 10 years or more. As illustrated in FIG. 12, the degradation of the characteristics of the MOSFET can be increased by the increase in the operating voltage. In other words, the degradation of the characteristics of the MOSFET can be accelerated in terms of time by the increase in the operating voltage.

According to the first embodiment, the operating voltage to be supplied to the second memory cell MC-S in the monitor memory circuit MON-S is used as the stress voltage Vst having a voltage value higher than that of the power source voltage Vd to be supplied to the other circuit blocks as the operating voltages. Therefore, degradation of the second memory cell MC-S is more accelerated than the other circuit blocks. In the bathtub curves illustrated in FIG. 13, a solid line (A) indicates a bathtub curve obtained when the other circuit blocks operate at the operating voltage Vd, and a broken line (B) indicates a bathtub curve obtained when the acceleration stress is applied to the second memory cell MC-S as described in the first embodiment. In the bathtub curve with the broken line (B), the wear-out failure occurring on the right side shifts to the left side. That is, a timing at which the wear-out failure occurs in the second memory cell MC-S can be set so as to be earlier than those of the other circuit blocks. As a result, by monitoring a state of the second memory cell MC-S, the wear-out failure can be detected before the wear-out failures occur in the other circuit blocks.

In this manner, according to the first embodiment, the semiconductor device MCU suitable for predicting the failure can be provided.

The semiconductor device is sometimes used for 10 years or more depending on purposes. Also in this case, the failure can be previously predicted before the semiconductor device breaks down due to the temporal degradation. Thus, the user can use the semiconductor device without any concern. Even if the wear-out failure occurs less than 10 years, the failure can be predicted before the failure occurs. Therefore, the manufacturer can collect and fix the semiconductor device at an early stage at which the failure is predicted.

According to the first embodiment, FIGS. 5 and 6 can be also considered to illustrate a method of diagnosing the semiconductor device. In FIG. 5, step SN2 can be considered to illustrate an operating process which operates the semiconductor device MCU including the storage circuit (the static memory SRAM) having the plurality of first static memory cells MC, and the logic circuit (such as the central processing circuit CPU). The test process exists in parallel to the operating process in terms of time. In FIG. 5, the test process includes steps SS1 to SS5. In the test process, the stress is applied to the second static memory cell MC-S. In the test process, the stress is applied to the second static memory cell MC-S during the period (a first period) determined by the stress time data TIM-B. After that, the second static memory cell is diagnosed at step SS4 (in a diagnosis process).

(Second Embodiment)

Figure 7:
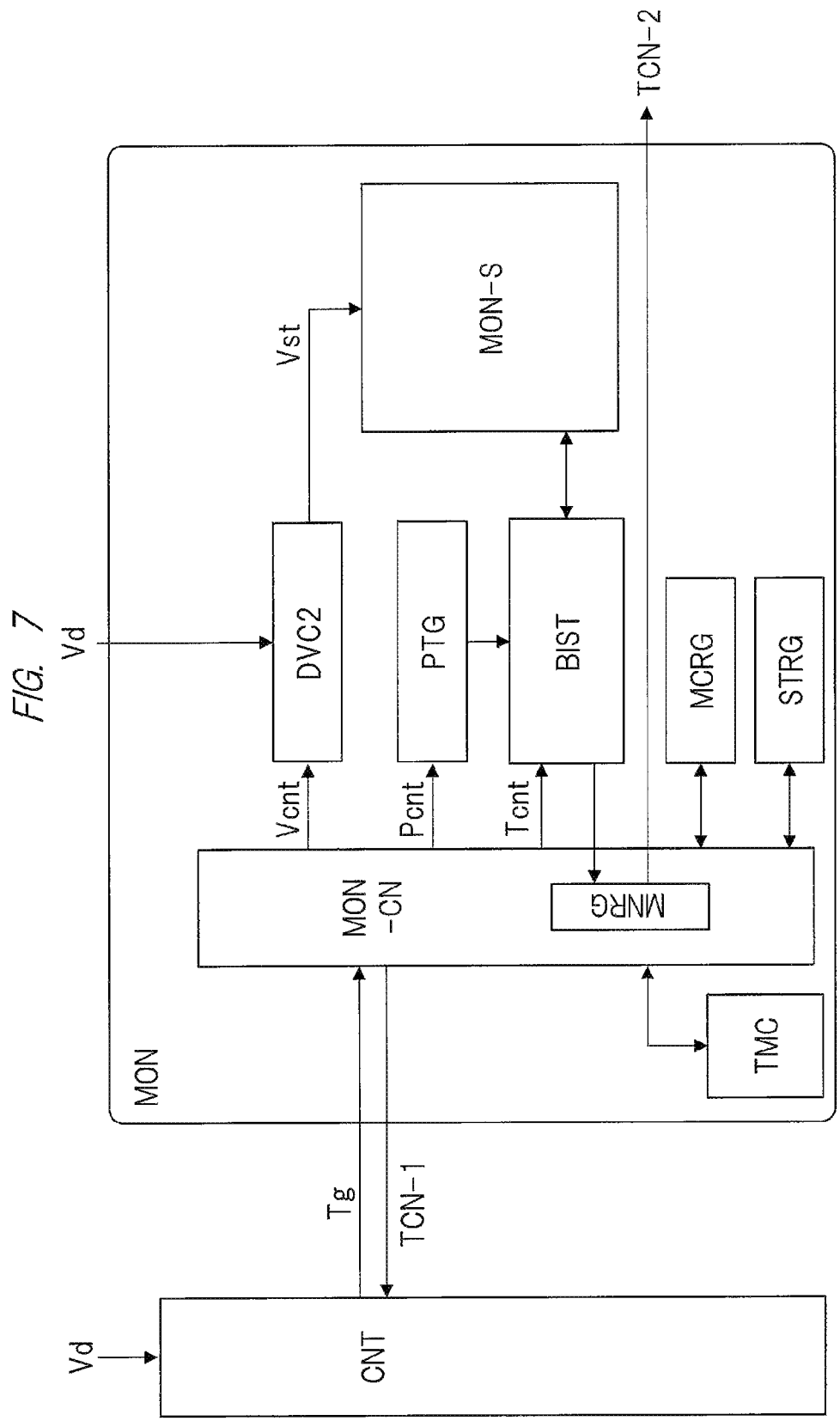
FIG. 7 is a block diagram of a configuration of a monitor circuit according to a second embodiment.

FIG. 7 is a block diagram of a configuration of a semiconductor device MCU according to a second embodiment. Since FIG. 7 is similar to FIG. 2, only differences will be mainly described here. In FIG. 2, the stress voltage generating circuit STVC having the power source boosting circuit UVC and the power source dropping circuit DVC is provided in the monitor circuit MON. On the other hand, according to the second embodiment, instead of the stress voltage generating circuit STVC, a power source dropping circuit DVC2 is provided in a monitor circuit MON.

When a voltage control signal Vcnt instructs the operation of the power source boosting circuit UVC illustrated in FIG. 2, the power source dropping circuit DVC2 outputs and supplies a voltage having the same voltage value as that of a power source voltage Vd to a monitor memory circuit MON-S as a stress voltage Vst.

On the other hand, when the voltage control signal Vcnt instructs the operation of the power source dropping circuit UVC illustrated in FIG. 2, the power source dropping circuit DVC2 supplies a voltage having a voltage value lower than that of the power source voltage Vd to the monitor memory circuit MON-S as the stress voltage Vst as similar to the power source dropping circuit UVC descried in the first embodiment. The voltage value of the stress voltage Vst at this time is determined in accordance with the lower limit original-performance data stored in a cell original-performance storage register MCRG as similar to the first embodiment.

Accordingly, when a stress applying function operates in a test circuit BIST, the monitor memory circuit MON-S operates by using the stress voltage Vst having the same voltage value as that of the power source voltage Vd as a power source voltage. On the other hand, a self-diagnosis function operates in the test circuit BIST, the monitor memory circuit MON-S operates by using the stress voltage Vst having a voltage value lower than that of the power source voltage Vd as the operating voltage as similar to the first embodiment.

Therefore, an operating voltage obtained when the stress is applied to a second memory cell MC-S in the monitor memory circuit MON-S is the same as, for example, that of the first memory cell MC in a static memory SRAM such as other circuit blocks. However, in the self-diagnosis, the stress voltage Vst having a voltage value lower than that of the power source voltage Vd is supplied to the second memory cell MC-S as the operating voltage. Accordingly, the degradation of the characteristics can be detected earlier than the other circuit blocks because of the self-diagnosis with the low voltage at which the degradation of the characteristics remarkably appears, so that the failure can be predicted as similar to the first embodiment.

Also according to the second embodiment, when a period in which the semiconductor device MCU operates, namely, a period in which the power source voltage Vd is supplied, is defined as 100%, the ratio of a period in which the stress is applied to the second memory cell MC-S can be appropriately changed by using the stress application time to be set in a stress time register STRG. According to the first embodiment, the ratio of the period in which the stress is applied to the second memory cell is set to be 50% so as to match with the ratio (50%) with which the other circuit blocks operate. According to the second embodiment, the stress voltage Vst in the stress application is lower than that of the first embodiment, and therefore, the ratio is desirably set to be higher than 50%. Accordingly, the stress to be applied to the second memory cell MC-S can be made larger than those of the other circuit blocks.

According to the second embodiment, it is not required to provide the power source boosting circuit UVC to the monitor circuit MON. Thus, the circuit scale of the monitor circuit MON can be reduced, and the cost of the semiconductor device MCU can be reduced.

(Third Embodiment)

Figure 8:
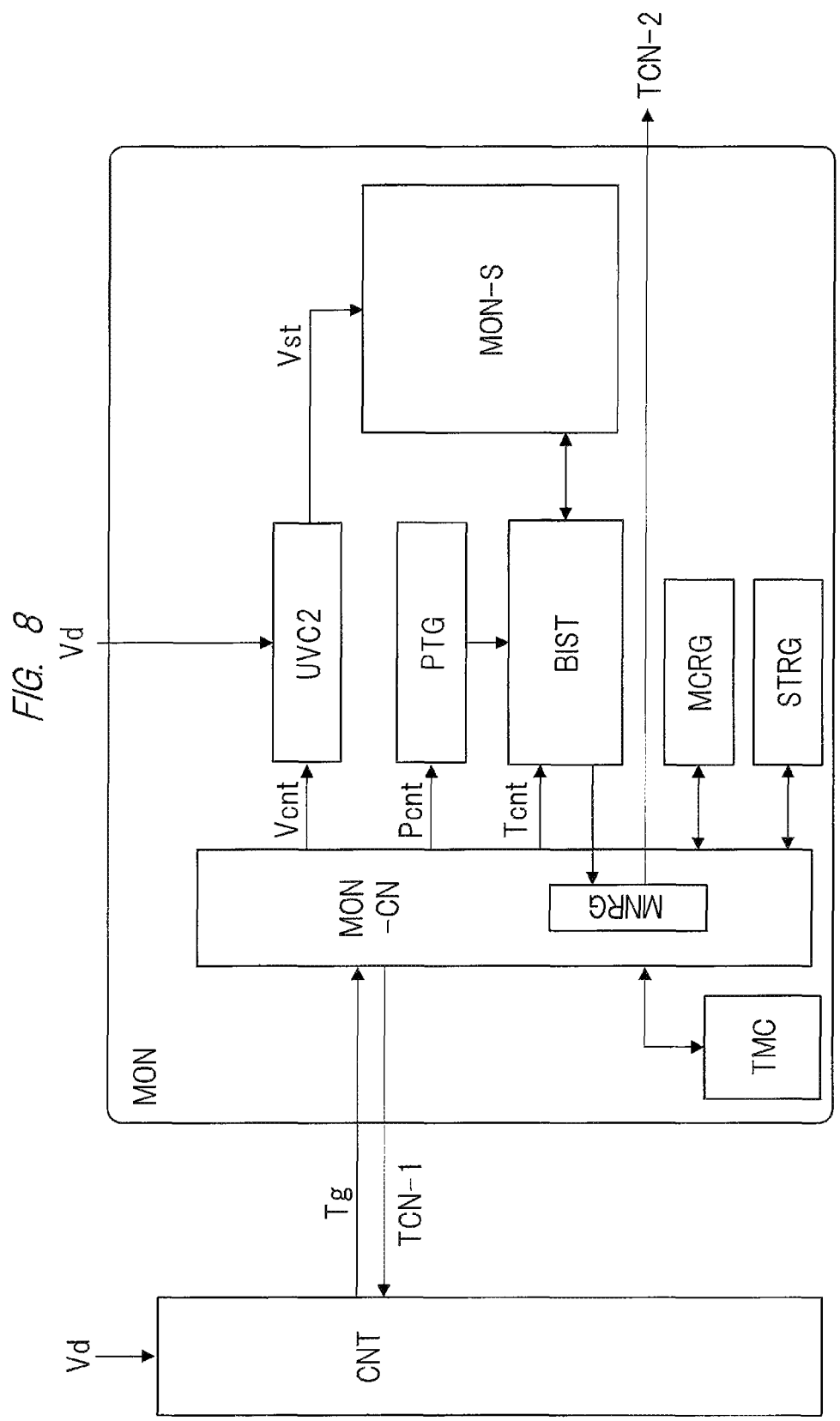
FIG. 8 is a block diagram of a configuration of a monitor circuit according to a third embodiment.

FIG. 8 is a block diagram of a configuration of a semiconductor device MCU according to a third embodiment. Since FIG. 8 is similar to FIG. 2, only differences will be mainly described. In FIG. 2, the stress voltage generating circuit STVC having the power source boosting circuit UVC and the power source dropping circuit DVC is provided to the monitor circuit MON. On the other hand, according to the third embodiment, instead of the stress voltage generating circuit STVC, a power source boosting circuit UVC2 is provided to a monitor circuit MON.

When a voltage control signal Vcnt instructs the operation of the power source dropping circuit DVC illustrated in FIG. 2, the power source boosting circuit UVC2 outputs and supplies a voltage having the same voltage value as that of a power source voltage Vd, to a monitor memory circuit MON-S as a stress voltage Vst.

On the other hand, when the voltage control signal Vcnt instructs the operation of the power source boosting circuit UVC illustrated in FIG. 2, the power source boosting circuit UVC2 supplies a voltage having a voltage value higher than that of the power source voltage Vd to the monitor memory circuit MON-S as the stress voltage Vst as similar to the power source boosting circuit UVC described in the first embodiment.

Accordingly, when a stress applying function operates in a test circuit BIST, the monitor memory circuit MON-S operates while using the stress voltage Vst having a voltage value higher than that of the power source voltage Vd as a power source voltage as similar to the first embodiment. On the other hand, when a self-diagnosis function operates in the test circuit BIST, the monitor memory circuit MON-S operates while using the stress voltage Vst having the same voltage value as that of the power source voltage Vd as an operating voltage.

Therefore, an operating voltage used when stress is applied to a second memory cell MC-S in the monitor memory circuit MON-S is made to be higher than, for example, an operating voltage of the first memory cells MC in other circuit blocks such as a static memory SRAM. On the other hand, in the self-diagnosis, the stress voltage Vst having the same voltage value as that of the power source voltage Vd is supplied to the second memory cell MC-S as the operating voltage. Accordingly, the stress to be applied to the second memory cell MC-S can be made to be larger than those of the other circuit blocks (for example, the first memory cells MC). As a result, degradation of characteristics in the second memory cell MC-S can be caused to be earlier than degradation of characteristics in the other circuit blocks. Thus, a failure can be predicted as similar to the first embodiment.

In the third embodiment, based on stress application time to be set in a stress time register STRG, the ratio of a period in which the stress is applied to the second memory cell MC-S can be also appropriately changed with respect to the ratio (50%) with which the other circuit blocks operate. A stronger stress may be applied to the second memory cell MC-S by changing the stress application time so that the ratio with which the second memory cell MC-S operates is higher than 50%.

According to the third embodiment, it is not required to provide the power source dropping circuit DVC in the monitor circuit MON. Thus, the circuit scale of the monitor circuit MON can be reduced, so that the cost of the semiconductor device MCU can be reduced.

(Fourth Embodiment)

Figure 9:
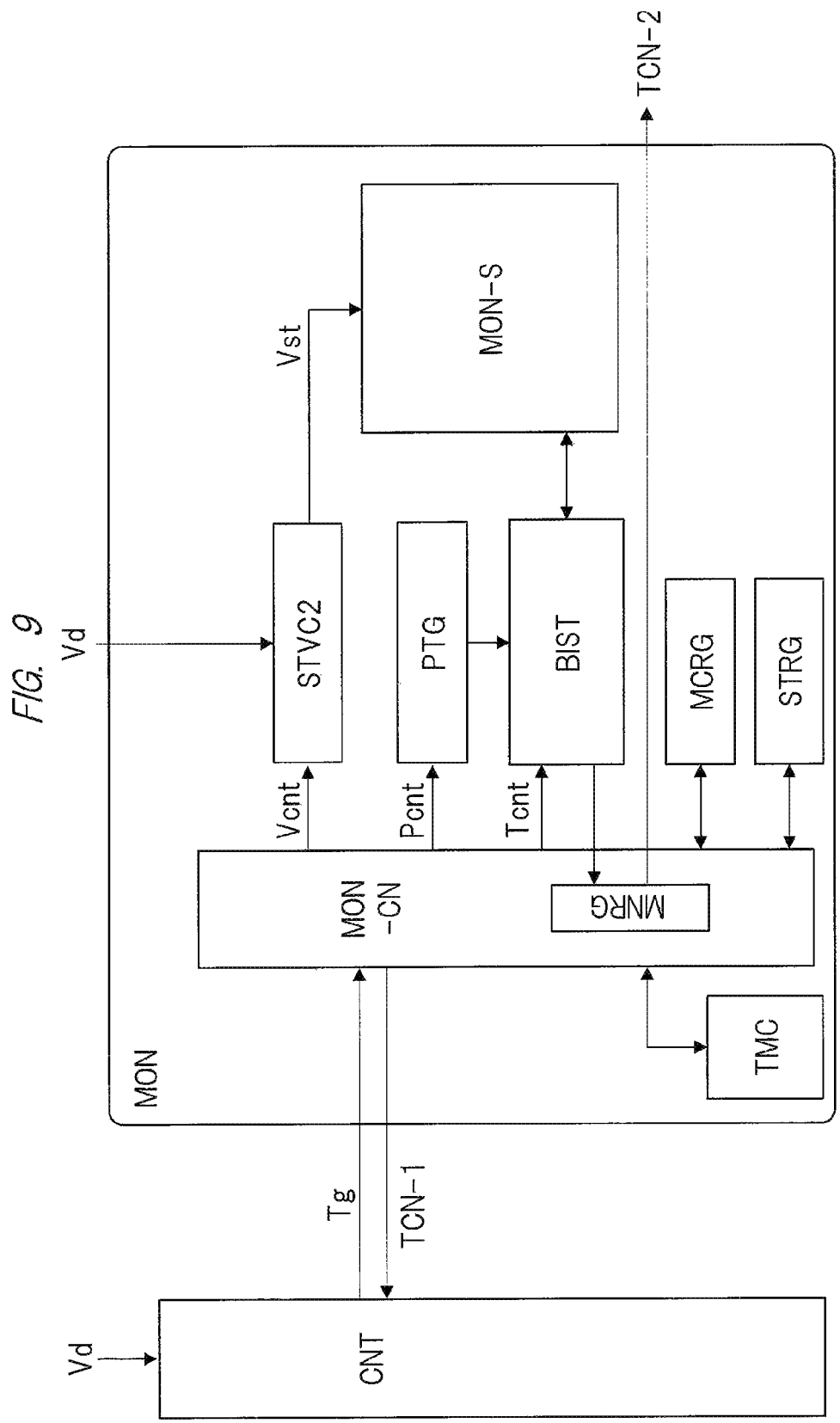
FIG. 9 is a block diagram of a configuration of a monitor circuit according to a fourth embodiment.

FIG. 9 is a block diagram of a configuration of a semiconductor device MCU according to a fourth embodiment. Since FIG. 9 is similar to FIG. 2, differences will be mainly described. In FIG. 2, the stress voltage generating circuit STVC is provided in the monitor circuit MON. On the other hand, according to the fourth embodiment, instead of the stress voltage generating circuit STVC, a power source applying circuit STVC2 is provided in a monitor circuit MON.

When a voltage control signal Vcnt instructs the operation of the power source dropping circuit DVC and the operation of the power source boosting circuit UVC illustrated in FIG. 2, the power source applying circuit STVC2 supplies a voltage having the same voltage value as that of a power source voltage Vd, to a monitor memory circuit MON-S as a stress voltage Vst.

Accordingly, when a stress applying function and a self-diagnosis function operates in a test circuit BIST, the monitor memory circuit MON-S operates while using the stress voltage Vst having the same voltage value as that of the power source voltage Vd as an operating voltage.

According to the fourth embodiment, based on stress application time to be set in a stress time register STRG, the ratio of a period in which the stress applying function operates in the test circuit BIST, namely, the ratio of a period in which stress is applied to the second memory cell MC-S, is set to be higher than 50% with respect to a ratio (50%) with which other circuit blocks operate. As a result, a period in which the second memory circuit MC-S operates is lengthened, so that the stress to be applied to the second memory cell MC-S can increase. By the increase in the stress, degradation of the second memory cell MC-S can be caused earlier. Thus, a failure can be predicted as similar to the first embodiment.

According to the fourth embodiment, the monitor circuit MON includes no power source boosting circuit UVC and no power source dropping circuit DVC. Thus, the circuit scale of the monitor circuit MON can be reduced, so that the cost of the semiconductor device MCU can be reduced.

FIGS. 10A, 10B, 11A and 11B are diagrams for describing the voltages to be supplied to the monitor memory circuit MON-S in the first embodiment to the fourth embodiment. Since the voltage to be supplied to the monitor memory circuit MON-S becomes the operating voltage of the second memory cell MC-S in the monitor memory circuit MON-S, FIGS. 10A, 10B, 11A, and 11B can be considered to illustrate the operating voltage to be supplied to the second memory cell MC-S. In FIGS. 10A, 10B, 11A, and 11B, the power source voltage Vd to be supplied to the other circuit blocks as the operating voltage is illustrated with a broken line as a reference. A vertical axis indicates the voltage in these drawings.

Figure 10A:
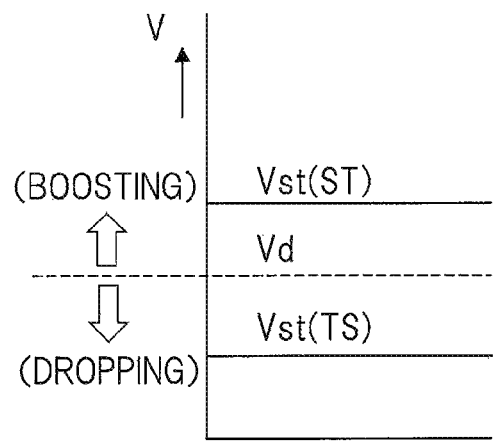
FIGS. 10A and 10B are diagrams for describing the first embodiment and the second embodiment.

FIG. 10A illustrates the stress voltage Vst to be supplied to the monitor memory circuit MON-S in the first embodiment. In FIG. 10A, a reference character "Vst (ST)" indicates a stress voltage formed by boosting the power source voltage Vd (the broken line) by the power source boosting circuit UVC illustrated in FIG. 2. Also, the Vst (TS) indicates a stress voltage formed by dropping the power source voltage Vd (the broken line) by the power source dropping circuit DVC illustrated in FIG. 2. When the stress applying function operates, the stress voltage Vst (ST) is supplied to the monitor memory circuit MON-S. When the self-diagnosis function operates, the stress voltage Vst (TS) is supplied to the monitor memory circuit MON-S.

Figure 10B:
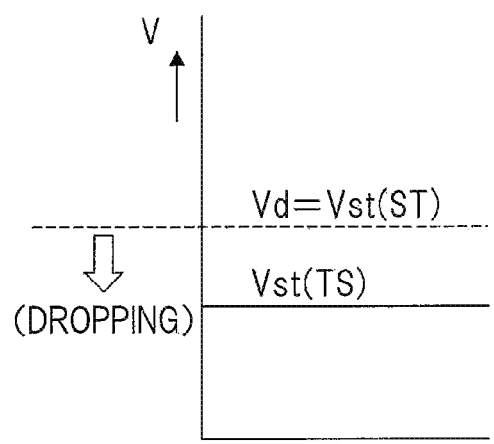

FIG. 10B illustrates the stress voltage Vst to be supplied to the monitor memory circuit MON-S in the second embodiment. In FIG. 10B, a reference character "Vst (TS)" indicates a stress voltage formed by dripping the power source voltage Vd (the broken line) by the power source dropping circuit DVC2 illustrated in FIG. 7.

As described in the second embodiment, when the stress applying function operates, the power source dropping circuit DVC2 supplies the stress voltage Vst (ST) having the same voltage value as that of the power source voltage Vd, to the monitor memory circuit MON-S. On the other hand, when the self-diagnosis function operates, the power source dropping circuit DVC2 supplies the formed stress voltage Vst (TS) to the monitor memory circuit MON-S.

Figure 11A:
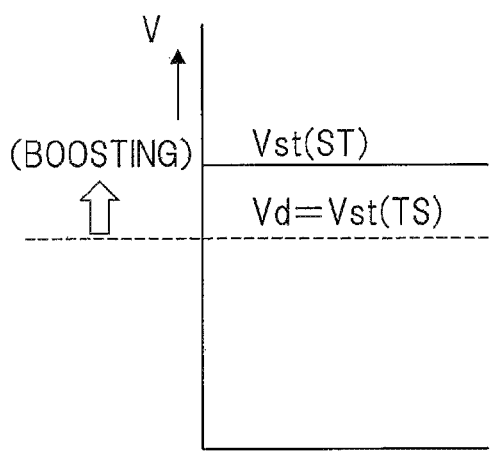
FIGS. 11A and 11B are diagrams for describing the third embodiment and the fourth embodiment.

FIG. 11A illustrates the stress voltage Vst to be supplied to the monitor memory circuit MON-S in the third embodiment. In FIG. 11A, a reference character "Vst (ST)" indicates a stress voltage formed by boosting the power source voltage Vd (the broken line) by the power source boosting circuit UVC2 illustrated in FIG. 8. When the stress applying function operates, the stress voltage Vst (ST) is supplied to the monitor memory circuit MON-S. On the other hand, when the self-diagnosis operates, the power source boosting circuit UVC2 supplies the stress voltage Vst(TS) having the same voltage value as that of the power source voltage Vd, to the monitor memory circuit MON-S.

Figure 11B:
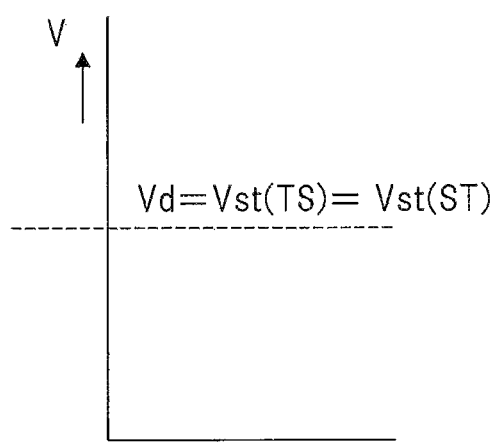

FIG. 11B illustrates the stress voltage Vst to be supplied to the monitor memory circuit MON-S in the fourth embodiment. In FIG. 11B, a reference character "Vst (ST)" indicates a stress voltage to be supplied to the monitor memory circuit MON-S when the stress applying function is operated by the power source applying circuit STVC2 illustrated in FIG. 9. Also, a reference character "Vst(TS)" indicates a stress voltage to be supplied to the monitor memory circuit MON-S by the power source applying circuit STVC2 when the self-diagnosis operates.

As illustrated in FIGS. 10A, 10B, 11A, and 11B, in the first embodiment, the stress voltage Vst (ST) having a voltage value higher than that of the power source voltage Vd and the stress voltage Vst (TS) having a voltage value lower than that of the power source voltage Vd are formed by the stress voltage generating circuit STVC, and then are supplied to the monitor memory circuit MON-S.

According to the second embodiment, the stress voltage Vst(TS) having a voltage value lower than that of the power source voltage Vd is formed by the power source dropping circuit DVC2. According to the third embodiment, the stress voltage Vst (ST) having a voltage value higher than that of the power source voltage Vd is formed by the power source boosting circuit UVC2. In the second and third embodiments, the power source voltage Vd can be applied as the stress voltage Vst (ST) or the stress voltage Vst (TS). Furthermore, according to the fourth embodiment, the power source voltage Vd can be applied as the stress voltage Vst(TS) and the stress voltage Vst (ST).

The first embodiment has described an example in which the reading operation and the writing operation are performed to the second memory cell MC-S during the stress application. However, the embodiment is not limited to this. For example, only the reading operation or only the writing operation may be repeatedly performed to the second memory cell MC-S during the stress application.

In the first to fourth embodiments, by the pieces of stress time data TIM-A and TIM-B to be set in the stress time register STRG, a period in which the stress is applied to the second memory cell MC-S is set with respect to a period in which the semiconductor device MCU operates, namely, a period in which the power source voltage Vd is supplied to the semiconductor device MCU. For example, when the static memory SRAM is considered, the stress is applied by the reading or writing operation to the first memory cell MC while using the power source voltage Vd as the operating voltage. Thus, a period in which the static memory SRAM operates (a period in which the reading or the writing is performed) with respect to the period in which the semiconductor device MCU operates can be considered to be a frequency (ratio) with which stress is applied to the first memory cell MC. Similarly, a period in which other circuit blocks such as the central processing circuit CPU operate can also be considered to be a frequency (ratio) with which stress is applied. These frequencies of the stress application are determined by the stress application time (the time of the stress).

In the monitor circuit MON, a period in which the stress applying function operates in the test circuit BIST can be also considered to be a frequency (ratio) with which stress is applied to the second memory cell MC-S.

In such consideration, according to the first embodiment, the frequency of the stress application to the second memory cell MC-S is the same as those of the other circuit blocks (for example, the SRAM, the CPU, and the PEP). On the other hand, according to the second and third embodiments, the frequency of the stress application to the second memory MC-S is desirably set to be higher than those of the other circuit blocks. According to the fourth embodiment, the frequency of the stress application to the second memory MC-S is set to be higher than those of the other circuit blocks.

In the foregoing, the invention made by the present inventors has been concretely described based on the embodiments. However, it is needless to say that the present invention is not limited to the foregoing embodiments and various modifications and alterations can be made within the scope of the present invention.

What is claimed is:

1. A semiconductor device including a logic circuit and a storage circuit including a plurality of first static memory cells formed on a semiconductor substrate, the semiconductor device comprising:
   a monitor circuit including a second static memory cell formed on the semiconductor substrate, the monitor circuit being configured to apply stress to the second static memory cell during a period in which the semiconductor device operates so that a state of the second static memory cell can be notified,
   wherein, by the monitor circuit, a frequency of stress applied to the second static memory cell is set to be higher than a frequency of stress applied to the storage circuit and the logic circuit during the period in which the semiconductor device operates.

2. The semiconductor device according to claim 1, wherein each of the plurality of first static memory cells includes a pair of inverter circuits which are connected between a first voltage node and a reference voltage node, and whose inputs and outputs are cross-connected to each other, and
   the second static memory cell includes a pair of inverter circuits which are connected between a second voltage node and a reference voltage node, and whose inputs and outputs are cross-connected to each other.

3. The semiconductor device according to claim 2, wherein the stress is applied by supplying a first voltage to the first voltage node and by supplying a second voltage having a voltage value different from a voltage value of the first voltage, to the second voltage node, during the period in which the semiconductor device operates.

4. The semiconductor device according to claim 3, wherein the second voltage has a voltage value higher than the voltage value of the first voltage when the stress is applied to the second static memory cell.

5. The semiconductor device according to claim 4, wherein the second voltage has a voltage value lower than the voltage value of the first voltage when the second static memory cell is diagnosed.

6. The semiconductor device according to claim 3, wherein the second voltage has a voltage value corresponding to the voltage value of the first voltage when the stress is applied to the second static memory cell, and
   the second voltage has a voltage value lower than the voltage value of the first voltage when the second static memory cell is diagnosed.

7. The semiconductor device according to claim 1, wherein the frequency of the stress applied to the second static memory cell is determined by time of the stress applied to the second static memory cell.

8. The semiconductor device according to claim 1, wherein the semiconductor device further includes a retaining circuit configured to retain a state of the second static memory cell so as to output the state retained in the retaining circuit.

9. The semiconductor device according to claim 1, wherein each of the plurality of first static memory cells, the second static memory cell, and the logic circuit, includes a transistor formed on the semiconductor substrate.

10. A method of diagnosing a semiconductor device, comprising:
    an operation step of operating the semiconductor device including a logic circuit and a storage circuit having a plurality of first static memory cells; and
    a test step of applying stress to a second static memory cell during the operation step,
    wherein a frequency of the stress applied to the second static memory cell is set to be higher than a frequency of stress applied to the storage circuit and the logic circuit during the period in which the semiconductor device operates.

11. The method of diagnosing the semiconductor device according to claim 10,
    wherein the test step includes:
    a first period in which the stress is applied to the second static memory cell; and
    a diagnosis step of diagnosing the second static memory cell after the first period.

12. The semiconductor device according to claim 1, wherein the stress includes applying a voltage greater than or less than a voltage in which the semiconductor device operates.

13. The semiconductor device according to claim 1, wherein the monitor circuit is configured to apply stress to the second static memory cell during the period in which the semiconductor device operates so that a state of the second static memory cell can be notified to predict failure of the plurality of first static memory cells and the logic circuit.

14. A semiconductor device, comprising:
    a plurality of first static memory cells formed on a semiconductor substrate; and
    a monitor circuit including a second static memory cell formed on the semiconductor substrate, the monitor circuit being configured to apply stress to the second static memory cell during a period in which the semiconductor device operates so that a state of the second static memory cell can be notified,
    wherein, by the monitor circuit, a frequency of the stress applied to the second static memory cell is set to be higher than a frequency of stress applied to the plurality of first static memory cells during the period in which the semiconductor device operates.

15. The semiconductor device according to claim 14, wherein each of the plurality of first static memory cells includes a pair of inverter circuits which are connected between a first voltage node and a reference voltage node, and whose inputs and outputs are cross-connected to each other, and
    the second static memory cell includes a pair of inverter circuits which are connected between a second voltage node and a reference voltage node, and whose inputs and outputs are cross-connected to each other.

16. The semiconductor device according to claim 15, wherein the stress is applied by supplying a first voltage to the first voltage node and by supplying a second voltage having a voltage value different from a voltage value of the first voltage, to the second voltage node, during the period in which the semiconductor device operates.

17. The semiconductor device according to claim 16,
wherein the second voltage has a voltage value higher than the voltage value of the first voltage when the stress is applied to the second static memory cell.

18. The semiconductor device according to claim 17,
wherein the second voltage has a voltage value lower than the voltage value of the first voltage when the second static memory cell is diagnosed.

19. The semiconductor device according to claim 16,
wherein the second voltage has a voltage value corresponding to the voltage value of the first voltage when the stress is applied to the second static memory cell,
wherein the second voltage has a voltage value lower than the voltage value of the first voltage when the second static memory cell is diagnosed, and
wherein the frequency of the stress applied to the second static memory cell is determined by tune of the stress applied to the second static memory cell.

20. The semiconductor device according to claim 14,
wherein the semiconductor device further includes a retaining circuit configured to retain a state of the second static memory cell so as to output the state retained in the retaining circuit, and
wherein each of the plurality of first static memory cells, and the second static memory cell includes a transistor formed on the semiconductor substrate.

* * * * *